US010591250B2

(12) United States Patent
Mock et al.

(10) Patent No.: US 10,591,250 B2
(45) Date of Patent: Mar. 17, 2020

(54) SWITCHLESS SENSING FOR ELECTRONIC DEVICES USED WITH DETERRENT DEVICES

(71) Applicant: Crosman Corporation, Bloomfield, NY (US)

(72) Inventors: Jeffrey W. Mock, Rochester, NY (US); John A. Kowalczyk, Jr., Fairport, NY (US); Eric St. Phillios, Fairport, NY (US); Christopher A. Gagliano, Rochester, NY (US); Michael W. Allen, Shortsville, NY (US); Robert J. MacBlane, Farmington, NY (US)

(73) Assignee: Crosman Corporation, Bloomfield, NY (US)

( * ) Notice: Subject to any disclaimer, the term of this patent is extended or adjusted under 35 U.S.C. 154(b) by 373 days.

(21) Appl. No.: 15/383,796

(22) Filed: Dec. 19, 2016

(65) Prior Publication Data

US 2018/0172401 A1 Jun. 21, 2018

(51) Int. Cl.
*F41G 1/35* (2006.01)

(52) U.S. Cl.
CPC ..................... *F41G 1/35* (2013.01)

(58) Field of Classification Search
CPC ........ F41A 17/00; F41A 17/06; F41A 17/063; F41A 17/066; F41A 17/20; F41G 1/32; F41G 1/34; F41G 1/35; F41G 13/0012; F41G 13/0043; F41G 13/005; F41G 13/0056; F41G 13/0087; F41G 13/0093
See application file for complete search history.

(56) References Cited

U.S. PATENT DOCUMENTS

| 2,017,585 | A | * | 10/1935 | Casey | ...................... F41G 1/35 362/114 |
| 4,353,056 | A | * | 10/1982 | Tsikos | ................... A61B 5/1172 361/283.1 |
| 4,429,413 | A | * | 1/1984 | Edwards | ............... A61B 5/1172 257/E27.006 |
| 5,056,254 | A | | 10/1991 | Bechtel | |
| 5,179,235 | A | | 1/1993 | Toole | |
| 5,194,007 | A | * | 3/1993 | Marshall | .................. F41A 33/02 42/114 |
| 5,282,594 | A | | 2/1994 | Huang | |
| 5,375,362 | A | | 12/1994 | McGarry et al. | |
| 5,406,730 | A | * | 4/1995 | Sayre | ........................ F41A 9/62 42/1.02 |
| 5,419,072 | A | * | 5/1995 | Moore | ....................... F41G 1/35 362/114 |
| 5,484,685 | A | | 1/1996 | Tai et al. | |
| 5,485,695 | A | * | 1/1996 | Glock | ........................ F41G 1/35 362/113 |
| 5,502,915 | A | * | 4/1996 | Mendelsohn | ......... F41A 17/066 42/70.11 |

(Continued)

OTHER PUBLICATIONS

Microchip, 6-Channel Capacitive Touch Sensor, CAP1206, Product Features Datasheet, 2013 Microchip Technology Inc., DS01567A-p. 1, Copyright 2013 Microchip Technology, Inc.

(Continued)

*Primary Examiner* — Derrick R Morgan
(74) *Attorney, Agent, or Firm* — Lee & Hayes, P.C.

(57) ABSTRACT

Switchless sensing is provided to control electronic devices of the type associated with deterrent devices.

21 Claims, 25 Drawing Sheets

(56) References Cited

U.S. PATENT DOCUMENTS

| | | | |
|---|---|---|---|
| 5,531,040 A | 7/1996 | Moore | |
| 5,590,486 A | 1/1997 | Moore | |
| 5,621,999 A * | 4/1997 | Moore | F41G 1/35 362/110 |
| 5,623,552 A * | 4/1997 | Lane | G06K 13/073 235/492 |
| 5,654,594 A * | 8/1997 | Bjornsen, III | F41A 35/06 200/293.1 |
| 5,706,600 A * | 1/1998 | Toole | F41G 1/35 362/114 |
| 5,758,448 A | 6/1998 | Thummel | |
| 5,766,000 A | 6/1998 | Thompson | |
| 5,862,248 A * | 1/1999 | Salatino | G06F 3/044 382/124 |
| 6,098,330 A * | 8/2000 | Schmitt | F41A 17/066 382/145 |
| 6,230,431 B1 | 5/2001 | Bear | |
| 6,237,271 B1 * | 5/2001 | Kaminski | F41A 17/063 42/70.01 |
| 6,286,242 B1 | 9/2001 | Klebes | |
| 6,293,039 B1 * | 9/2001 | Fuchs | F41A 17/04 42/70.04 |
| 6,321,478 B1 | 11/2001 | Klebes | |
| 6,363,648 B1 * | 4/2002 | Kranich | F41G 1/35 42/114 |
| 6,378,237 B1 * | 4/2002 | Matthews | H01H 3/20 42/124 |
| 6,393,752 B1 | 5/2002 | Oliver et al. | |
| 6,481,140 B1 * | 11/2002 | Marshall | F41A 17/063 42/70.01 |
| 6,499,243 B1 * | 12/2002 | Herzog | F41A 17/066 42/70.06 |
| 6,563,940 B2 * | 5/2003 | Recce | B60R 25/04 382/120 |
| 6,678,984 B1 * | 1/2004 | Rapp | F41A 17/066 42/70.01 |
| 6,711,843 B2 * | 3/2004 | Klebes | F41A 17/066 42/70.11 |
| 6,774,396 B1 * | 8/2004 | Chang | G06K 9/0004 250/208.1 |
| 6,861,944 B1 * | 3/2005 | Hoepelman | A43B 3/0005 235/380 |
| 7,117,627 B2 | 10/2006 | Woodmansee, III et al. | |
| 7,360,332 B2 * | 4/2008 | Rozovsky | F41A 17/06 42/106 |
| 7,368,921 B2 * | 5/2008 | Deangelis | G01D 5/2405 324/661 |
| 7,506,468 B2 * | 3/2009 | Farrell | F41A 17/06 42/70.01 |
| 7,726,061 B1 | 6/2010 | Thummel | |
| 7,845,817 B1 * | 12/2010 | Miller | F41G 1/35 362/110 |
| 8,040,142 B1 * | 10/2011 | Bokma | H03K 17/955 324/658 |
| 8,109,024 B2 | 2/2012 | Abst | |
| 8,117,782 B2 | 2/2012 | Gross et al. | |
| 8,121,283 B2 * | 2/2012 | Peng | G06F 3/044 345/173 |
| 8,256,154 B2 | 9/2012 | Danielson et al. | |
| 8,662,694 B1 * | 3/2014 | Izumi | F41G 1/34 362/109 |
| 8,819,979 B2 | 9/2014 | Kelly | |
| 8,887,430 B2 * | 11/2014 | Wichner | F41A 17/12 42/70.01 |
| 9,328,994 B2 | 5/2016 | Hovsepian | |
| 9,335,109 B2 * | 5/2016 | Bensayan | F41A 17/063 |
| 9,658,022 B1 | 5/2017 | Farrell | F41A 33/00 |
| 9,723,659 B2 * | 8/2017 | Makosinski | H01L 35/30 |
| 9,798,917 B2 * | 10/2017 | Benkley, III | G06K 9/00013 |
| 9,851,178 B2 * | 12/2017 | Cosso | F41G 1/35 |
| 9,909,830 B1 * | 3/2018 | Toole | F41A 35/02 |
| 10,054,396 B2 * | 8/2018 | Hovsepian | F41G 1/35 |
| 2002/0100202 A1 | 8/2002 | Lin et al. | |
| 2002/0148153 A1 * | 10/2002 | Thorpe | F41G 1/35 42/114 |
| 2002/0194767 A1 * | 12/2002 | Houde-Walter | F41G 1/35 42/114 |
| 2003/0029073 A1 * | 2/2003 | Danielson | F41G 1/35 42/146 |
| 2003/0133286 A1 * | 7/2003 | Kim | F41G 1/35 362/110 |
| 2004/0128900 A1 | 7/2004 | Chen et al. | |
| 2005/0116815 A1 * | 6/2005 | Chen | F41G 1/35 340/331 |
| 2005/0257411 A1 * | 11/2005 | Wootton | F41A 17/063 42/70.01 |
| 2005/0257415 A1 | 11/2005 | Solinsky et al. | |
| 2006/0026886 A1 | 2/2006 | Doukas | |
| 2006/0101694 A1 * | 5/2006 | Matteson | F41A 17/06 42/69.01 |
| 2006/0162225 A1 * | 7/2006 | Danielson | F41C 23/10 42/117 |
| 2006/0242879 A1 * | 11/2006 | Schmitter | F41A 17/063 42/70.01 |
| 2007/0039226 A1 * | 2/2007 | Stokes | F41C 23/16 42/146 |
| 2007/0113462 A1 * | 5/2007 | Ho | F41G 11/003 42/146 |
| 2007/0193103 A1 | 8/2007 | Cheng | |
| 2007/0277422 A1 * | 12/2007 | Ding | F41G 1/35 42/146 |
| 2008/0024455 A1 * | 1/2008 | Lee | G06F 3/044 345/173 |
| 2008/0032268 A1 * | 2/2008 | Farrell | F41A 17/06 434/16 |
| 2008/0060246 A1 * | 3/2008 | Rozovsky | F41A 17/06 42/70.01 |
| 2008/0204251 A1 * | 8/2008 | Hudson | F41A 17/06 340/573.1 |
| 2008/0277171 A1 * | 11/2008 | Wright | G06F 1/3203 178/18.06 |
| 2009/0293855 A1 * | 12/2009 | Danielson | F41G 1/35 124/87 |
| 2009/0307955 A1 | 12/2009 | NuDyke | |
| 2009/0322410 A1 * | 12/2009 | David | G06F 3/0412 327/517 |
| 2010/0033108 A1 | 2/2010 | Mironichev | |
| 2010/0064568 A1 * | 3/2010 | NuDyke | F41A 17/06 42/117 |
| 2010/0154279 A1 * | 6/2010 | Polyzos | F41C 23/10 42/117 |
| 2010/0162610 A1 | 7/2010 | Moore et al. | |
| 2011/0035984 A1 | 2/2011 | Liu | |
| 2011/0047851 A1 | 3/2011 | Mock et al. | |
| 2011/0061283 A1 | 3/2011 | Cavallo et al. | |
| 2011/0107648 A1 | 5/2011 | Tuz | |
| 2011/0167707 A1 | 7/2011 | Gross et al. | |
| 2011/0232151 A1 | 9/2011 | Zukowski | |
| 2012/0047787 A1 | 3/2012 | Curry | |
| 2012/0085015 A1 | 4/2012 | Wei | |
| 2012/0124885 A1 * | 5/2012 | Caulk | F41G 1/35 42/146 |
| 2012/0141957 A1 | 6/2012 | Miller | |
| 2012/0144718 A1 * | 6/2012 | Danielson | F41G 1/35 42/117 |
| 2012/0198748 A1 | 8/2012 | Ospino Orozco | |
| 2012/0311910 A1 | 12/2012 | Mironichev | |
| 2013/0014736 A1 * | 1/2013 | Risicato | F41C 23/16 124/80 |
| 2013/0019510 A1 * | 1/2013 | Kemmerer | F41A 17/066 42/1.01 |
| 2013/0125441 A1 * | 5/2013 | Westwood | F41A 17/02 42/70.05 |
| 2013/0185981 A1 * | 7/2013 | Brabandt | F41G 1/35 42/117 |
| 2013/0185982 A1 * | 7/2013 | Hilbourne | F41G 1/35 42/117 |
| 2014/0007485 A1 * | 1/2014 | Castejon, Sr. | F41G 1/35 42/117 |

(56) References Cited

U.S. PATENT DOCUMENTS

| | | | |
|---|---|---|---|
| 2014/0245650 A1* | 9/2014 | Abst | F41G 11/003 42/84 |
| 2014/0290110 A1* | 10/2014 | Stewart | H04W 4/70 42/70.11 |
| 2014/0366419 A1* | 12/2014 | Allan | F41A 17/06 42/70.06 |
| 2015/0040453 A1* | 2/2015 | Ballard | F41A 17/066 42/70.11 |
| 2015/0113851 A1* | 4/2015 | Bensayan | F41A 17/063 42/117 |
| 2015/0181686 A1* | 6/2015 | Schulze | H05H 1/34 219/121.51 |
| 2015/0184978 A1 | 7/2015 | Hedeen | |
| 2015/0199547 A1* | 7/2015 | Fraccaroli | G06Q 10/10 340/10.1 |
| 2015/0267998 A1* | 9/2015 | Grace, Jr. | F41G 1/345 42/117 |
| 2015/0267999 A1* | 9/2015 | Hovsepian | F41G 1/35 42/117 |
| 2016/0165192 A1* | 6/2016 | Saatchi | H04N 5/772 386/227 |
| 2016/0209171 A1* | 7/2016 | Hovsepian | F41G 1/35 |
| 2017/0010062 A1* | 1/2017 | Black | F41A 17/063 |
| 2017/0010067 A1* | 1/2017 | Cosso | F41G 1/35 |
| 2017/0059274 A1* | 3/2017 | Crist | F41A 17/06 |
| 2017/0234637 A1* | 8/2017 | Patel | F41C 23/10 42/1.01 |
| 2017/0248388 A1* | 8/2017 | Young | F41C 33/029 |
| 2017/0268842 A1* | 9/2017 | Kennair, Jr. | F41A 17/06 |
| 2017/0284769 A1* | 10/2017 | Spielberger | F41C 33/0254 |
| 2017/0302881 A1 | 10/2017 | Sakiewicz et al. | |
| 2018/0003462 A1* | 1/2018 | Chavez | F41G 1/345 |
| 2018/0068105 A1* | 3/2018 | Shapiro | H04L 63/083 |
| 2018/0087757 A1* | 3/2018 | Mock | F21V 23/003 |
| 2018/0106568 A1* | 4/2018 | Hedeen | H04N 5/2257 |
| 2018/0195836 A1* | 7/2018 | Matthews | F41G 1/35 |
| 2018/0259610 A1* | 9/2018 | Gagliano | G01S 1/70 |
| 2018/0292170 A1* | 10/2018 | Gagliano | F41G 1/35 |
| 2018/0299217 A1* | 10/2018 | Hedeen | F41A 9/62 |
| 2019/0017782 A1* | 1/2019 | Toole | F41G 1/35 |
| 2019/0049221 A1* | 2/2019 | Zimmer | F41G 11/003 |

OTHER PUBLICATIONS

Azoteq, IQ Switch ProxSense Series, Hardware Description, first release Jun. 2015, www.azoteq.com.

Fischer, A Capacitive Touch Sensors, Application Fields, technology overview and implementation example. [online], Fujitsu Microelectronics Europe GmbH, V4, Jan. 12, 2010, 12 pages.

Cypress Perform, Cypress Semiconductor Corporation, 2010-2016, "Getting Started with Capsense", AN64846, Document No. 001-64846 Rev. T, Cypress Semiconductor, p. 1-64, http://www.cypress.com.

Cypress Semiconductor Corporation, 2010-2016, "Getting Started with CapSense", AN64846, Document No. 001-64846 Rev. T, Cypress Semiconductor, p. 65-103, http://www.cypress.com.

Cypress Semiconductor Corporation, 2010-2016, "Getting Started with CapSense", AN64846, Document No. 001-64846 Rev. T, Cypress Semiconductor, p. 104-132, http://www.cypress.com.

"Biometric CMOS sensor aids fingerprint reconstruction"—Vision Systems Design, [online] May 1, 1999, (retrieved on Oct. 18, 2016) Retrieved from the Internet< URL: http://www.vision-systems.com/articles/print/volume-4/issue-5/technology-trends/biometrics.com, 2 pages.

Greene, M., "A Review of Gun Safety Technologies", National Institute of Justice Research Report, Jun. 2013, U.S. Department of Justice, 96 pages.

Rock Island Auction Company, "Night Pistol" Luger Semi-Automatic Pistol with Flashlight Attachment, DWM-06/34, Lot 1589, [online], Dec. 2, 2016 [Retrieved Dec. 8, 2016] Retrieved from URL: http://www.rockislandauction.com/detail/55/1589.com.

Pratt, Susan, 'Capacitance Sensors for Human Interfaces to Electronic Equipment', Analog Dialogue 40-10, [online] Oct. 2006, Ask the Application Engineer-35. Retrieved from URL: http://www.analog.com/analogdialogue.

ArmaLaser, TR 1 Touch-Reflex Laser System, FAQ page, https://web.archive.org/web/20121215085738/http://www.armalaser.com/tr1faqs.html.

ArmaLaser TR 5, FLX Finger Touch Option, http://web.archive.org/web/20140828190114/http://www.armalaser.com:80/whatisanflx.html.

ArmaLaser, FAQ's page, GTO, http://web.archive.org/web/20170320101144/https://armalaser.com/gto-fix-series-lasers.

* cited by examiner

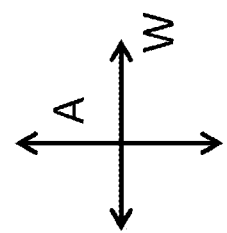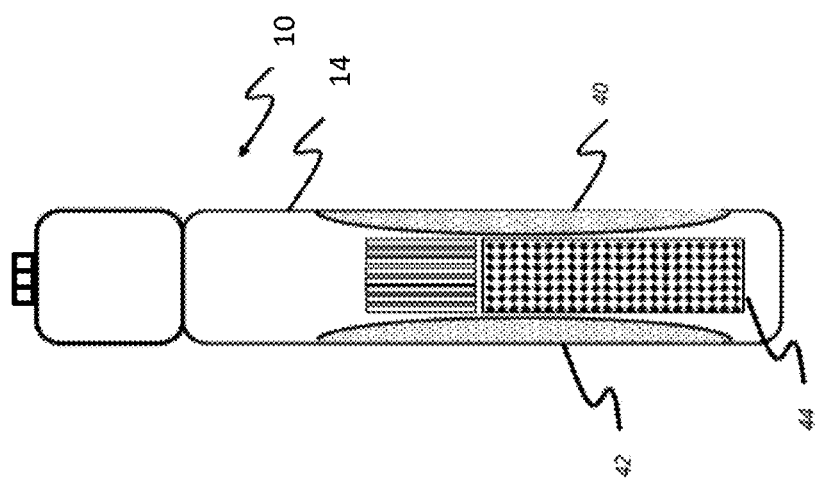
FIG. 2 PRIOR ART

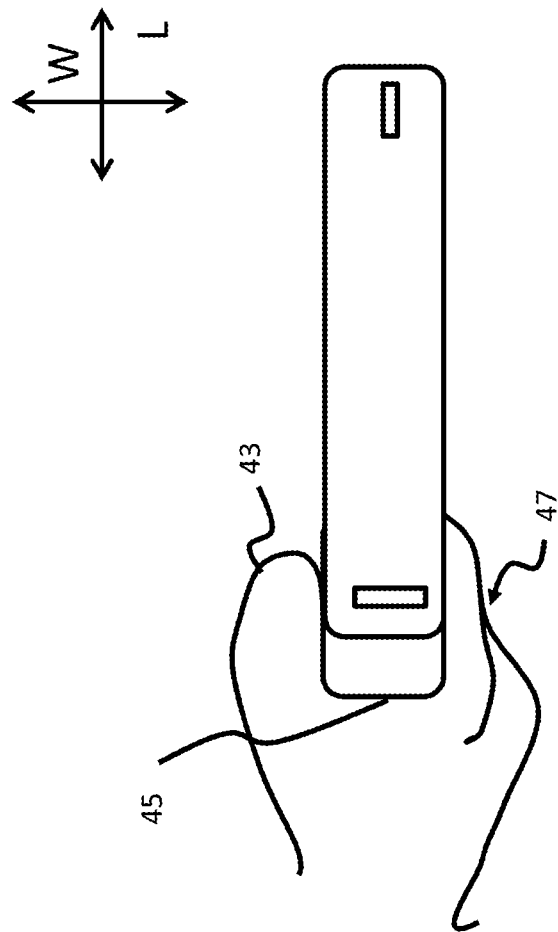
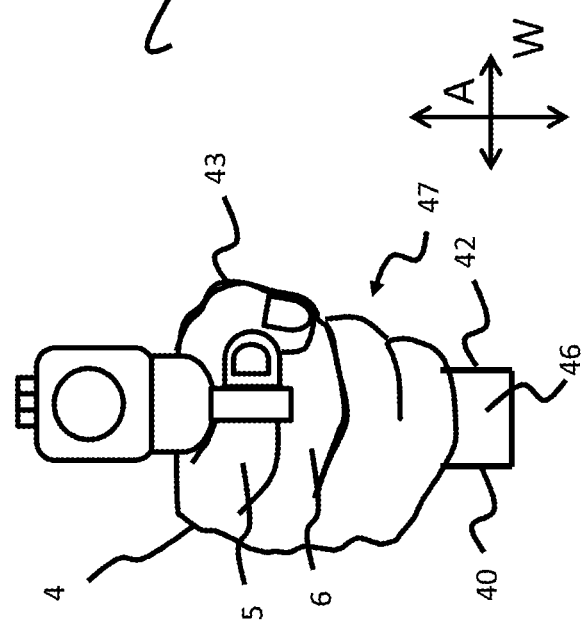
FIG. 3B PRIOR ART
FIG. 3A PRIOR ART

SWITCHLESS SENSING FOR ELECTRONIC DEVICES USED WITH DETERRENT DEVICES

CROSS REFERENCE TO RELATED APPLICATIONS

N/A

FIELD OF THE INVENTION

The invention relates to electronic devices of the type used with grip mounted devices such as firearms and other deterrent devices.

DESCRIPTION OF RELATED ART

It is increasingly common for the users and manufacturers of firearms and other deterrent devices to want to combine their deterrent devices with electronic systems that provide information and assistance useful in operating the deterrent device. Such electronic systems may offer aid in aiming, viewing, and illuminating a potential target area. These electronic systems may be incorporated into a deterrent device or may be mounted or otherwise mechanically joined to the deterrent device after manufacture.

A long standing problem that the designers of electronic systems and deterrent devices that incorporate such electronic systems have faced is that of how to activate electronic systems. It will be appreciated that deterrent devices are conventionally gripped by one or both hands of a user and that the primary purpose the action of gripping the deterrent device is to aim and use the deterrent device to effectively deter an attack. Accordingly it is valuable for the electronic device to activate in a manner that does not require a user to change his or her grip.

One approach to meeting this challenge is to provide activation surfaces that are proximate to where the hands of a user are positioned when gripping the deterrent device. However, deterrent devices themselves may require user actions beyond gripping the firearm and have control, access and actuation surfaces that are positioned so that they can be quickly and easily reached by a user gripping the deterrent device. Accordingly, there can be few opportunities to provide activation surfaces for electronic devices in locations that can be conveniently accessed by hands that are also at least in part gripping the grip surfaces of the deterrent device.

There have been several different mechanisms proposed for activating the electronic aiming device used with a deterrent device to provide rapid activation of an electronic aiming device when the firearm is grasped. Controlled activation of an electronic aiming system has been provided by providing electronic activations switches with activation surfaces that are alongside and forward of a trigger guard. In such circumstances, a user grasping the deterrent device with a finger in a safe position alongside the trigger but not in the trigger guard may activate the aiming device. Additionally, in some types of electronic aiming systems, a portion of an activation surface may overlap a portion of a trigger guard or trigger well area and be activated as a user puts his or her finger into the trigger guard or trigger well area. This allows a user to control whether the electronic aiming device is activated and when grasping the deterrent device. This arrangement can be found popular electronic laser aiming devices such as the Unimax line of aiming lasers sold by LaserMax, Inc., Rochester, N.Y., USA.

Alternatively, the action of gripping the deterrent device can be used to activate electronic devices. Typically, this is accomplished by positioning a switch on a surface of a gripped portion of a deterrent device. For example, as is shown and described in U.S. Pat. No. 8,256,154, entitled Laser gunsight system for a firearm trigger guard, a sighting device has a body having an first portion including an illumination device. The body has an engagement feature to join the first body portion to a trigger guard of a firearm. The body has an elongated extension portion that extends from the first portion. The extension portion is shaped to underlie a lower portion of the trigger guard from the first portion to the front strap. The extension portion has a free end including a switch, and the extension portion includes a conductor operably connecting the switch to the illumination device. A user who is trained to do so can grip the firearm so that one of the user's fingers applies sufficient force against the switch to activate the switch. This allows such a trained user to combine the actions of grasping the firearm and activating the illumination device.

In another alternative, it has been known to use electrical conductivity of the hands of a user as part of a switch. In examples of this type, adjacent electrical contacts or plates are provided on a portion of a gun that will be gripped or otherwise contacted. For example, a weapon and flashlight combination known as the Night Pistol was used in Germany during the 1940s. The Night Pistol was a customized Luger pistol that included a flashlight with two brass plates on the grip. The brass plates were separated by an insulator and connected to the flashlight so that when a user's hand closed about the grip, the hand provided an electrical path between the brass plates to activate the flashlight. This approach has the advantages of not requiring any particular pressure at a particular location on the firearm and of not requiring a special gripping motion.

More recent versions of this approach are described in U.S. Pat. No. 9,328,994, entitled Flexible Switch for Laser Gun Sight and U.S. Pat. Pub. 2016/0209171, entitled Flush Switch for Handgun Accessory. In the '994 patent, a handgun mounted laser sight is combined with a trigger-guard mountable switch having flexible connections that accommodate various different geometries of handgun frames. The flexible connections terminate at one end at the laser sight and at the other end at a pair of individual conductors are electrically insulated from each other but exposed and arranged so that a finger of a hand gripping the firearm will bridge the individual conductors to provide an electrical path between the exposed ends effectively closing a switch that includes the hand of the user. When this switch is closed the laser sight activates. In the '171 application efforts are made to, for example, embed the individual conductors within an external housing of the laser so that generally only the exposed ends of the individual conductors are exposed to activating contact.

One challenge created by the '994 patent and the '171 publication is that they leave conductors exposed to elements so that contact with any conductor, including but not limited to water can activate the laser sight or flashlight. Further, such approaches may not activate when the user has a gloved hand, when there are insulating contaminants on the hand or the conductors that prevent an electrical connection. Additionally, such exposed conductors can be subject to damage through incidental contact.

Additionally, both the approach of providing a complete switch on a gripped portion of the firearm and positioning conductors to form a switch with the hand create further challenges in that there must be a finger or other portion of the hand at the precise locations necessary to establish contact with the mechanical switch or the electrical contacts. It will be appreciated that a slight movement of a hand or finger after contact has been made has the potential to cause the light or laser controlled by the switch to deactivate.

What is needed therefore is a new approach to activating electronics that are associated with deterrent devices such as firearms that allows a user to activate the electronics without the distraction associated with using special amounts of force or contact at special locations, that allows rapid and unimpeded gripping of a deterrent device, yet is free of the difficulties associated with using exposed conductors and the need to maintain precise placement of a hand against such conductors.

One effort to meet this need is found in U.S. Pat. Pub. No. 2015/0184978 entitled Gun Holster and Electronic Accessory which generally describes incorporating a magnetic detector into an electronic aiming device that can be used to sense a magnet in a specially designed or modified holster for the deterrent device. In this approach, when the deterrent device is in the holster, the magnetic detector detects a magnetic field of the magnet and deactivates the electronic aiming device. However, when the deterrent device is drawn from the holster, magnetic detector detects the absence of the magnetic field provided by the holster magnet and activates the electronic device automatically.

It will be appreciated that this approach requires specially modified holsters as well as carrying a holster with a magnet that may erase or modify signals recorded on magnetic media such as magnetically readable stripes of the types found on credit cards and identification badges. Additionally, it will be appreciated that many users of deterrent devices do not keep such devices holstered but rather position them in other locations such as in small bedside gun safes or other locations where a magnetic driven action may not be appropriate.

What is needed therefore is an alternative direction for providing rapid and automatic activation of electronic aiming systems and other electronic devices for use for deterrent devices.

BRIEF SUMMARY OF THE INVENTION

Deterrent devices, electronic devices for use with a deterrent devices and sensing systems are provided. In one aspect the electronic device has a housing with a mounting portion joinable to the deterrent device to position a conductive surface relative to a sensing space where a part of the body of the user of the deterrent device is expected to be found when using the deterrent device; an electronic system, an excitation system connected to the conductive surface and adapted to cause a time varying electric field to be created about the first conductive surface and a capacitance sensing circuit adapted to sense capacitance between the conductive surface and the capacitance sensing circuit. A control system is connected to the capacitance sensing circuit and adapted to detect changes in the sensed capacitance and adapted make decisions about the operation of the electronic system electronic system based upon the detected changes. An insulator prevents electrical conduction between the body of the user and at least one of the conductive surface and the capacitive sensing circuit. The electric field extends through the insulator into the sensing space so that the presence of the part of the body in the sensing space will change the sensed capacitance.

In another aspects, electronic devices for use with a deterrent device are provided. The electronic device has a housing with a mounting portion joinable to the deterrent device to position a first conductive surface relative and a second conductive surface relative to a sensing space where a part of the body of the user of the deterrent device is expected to be found when using the deterrent device, an electronic system, an excitation system connected to the conductive surface and adapted to cause a time varying electric field to be created about the first conductive surface and the second conductive surface; and a capacitance sensing circuit adapted to measure a capacitance between the first conductive surface and the second conductive surface. A control system connected to the capacitance sensing circuit and adapted make decisions about the operation of the electronic system based upon detected changes in the capacitance between the first conductive surface and the second conductive surface. An insulator preventing electrical conduction between the body of the user and at least one of the first conductive surface and the second conductive surface. The electric field extends through the insulator into the sensing space so that the presence of the part of the body in the sensing space will change the capacitance measured between the first conductive surface and the second conductive surface.

In still other aspects, deterrent devices are provided having a deterrent system adapted for user control, an electronic system to assist the user in using the user controlled deterrent system and a housing with a mounting portion joinable to the deterrent system to position a first conductive surface relative to a sensing space where a part of the body of the user of the deterrent device is expected to be found when controlling the deterrent system, an excitation system connected to the conductive surface and adapted to cause a time varying electric field to be created about the first conductive surface; and a capacitance sensing circuit adapted to sense capacitance between the conductive surface and the capacitance sensing circuit. A control system is connected to the capacitance sensing circuit and adapted to detect changes in the sensed capacitance and adapted make decisions about the operation of the electronic system electronic system based upon the detected changes; and an insulator preventing electrical conduction between the body of the user and at least one of the conductive surface and the capacitive sensing circuit. The electric field extends through the insulator into the sensing space so that the presence of the part of the body in the sensing space will change the sensed capacitance.

In still other aspects, deterrent devices are provided having a deterrent system adapted for user control and an electronic system to assist the user in using the user controlled deterrent system, a housing with a mounting portion joinable to the deterrent device to position a first conductive surface relative to a sensing space where a part of the body of the user of the deterrent device is expected to be found when controlling the deterrent device, an excitation system connected to the conductive surface and adapted to cause a time varying electric field to be created about the first conductive surface and the second conductive surface, and a capacitance sensing circuit adapted to measure a capacitance between the first conductive surface and the second conductive surface and a control system connected to the capacitance sensing circuit and adapted make decisions about the operation of the electronic system based upon detected changes in the capacitance between the first conductive surface and the second conductive surface. An insulator prevents electrical conduction between the body of the user and at least one of the first conductive surface and the second conductive surface. The electric field extends through the insulator into the sensing space so that the presence of the part of the body in the sensing space will change the capacitance measured between the first conductive surface and the second conductive surface.

BRIEF DESCRIPTION OF THE DRAWINGS

FIG. 2 is a back view of the deterrent device of FIG. 1.

FIGS. 3A and 3B illustrate, respectively, front and top views of the deterrent device of FIG. 1 as gripped by a hand of a user.

DETAILED DESCRIPTION OF THE DRAWINGS

Figure 1:
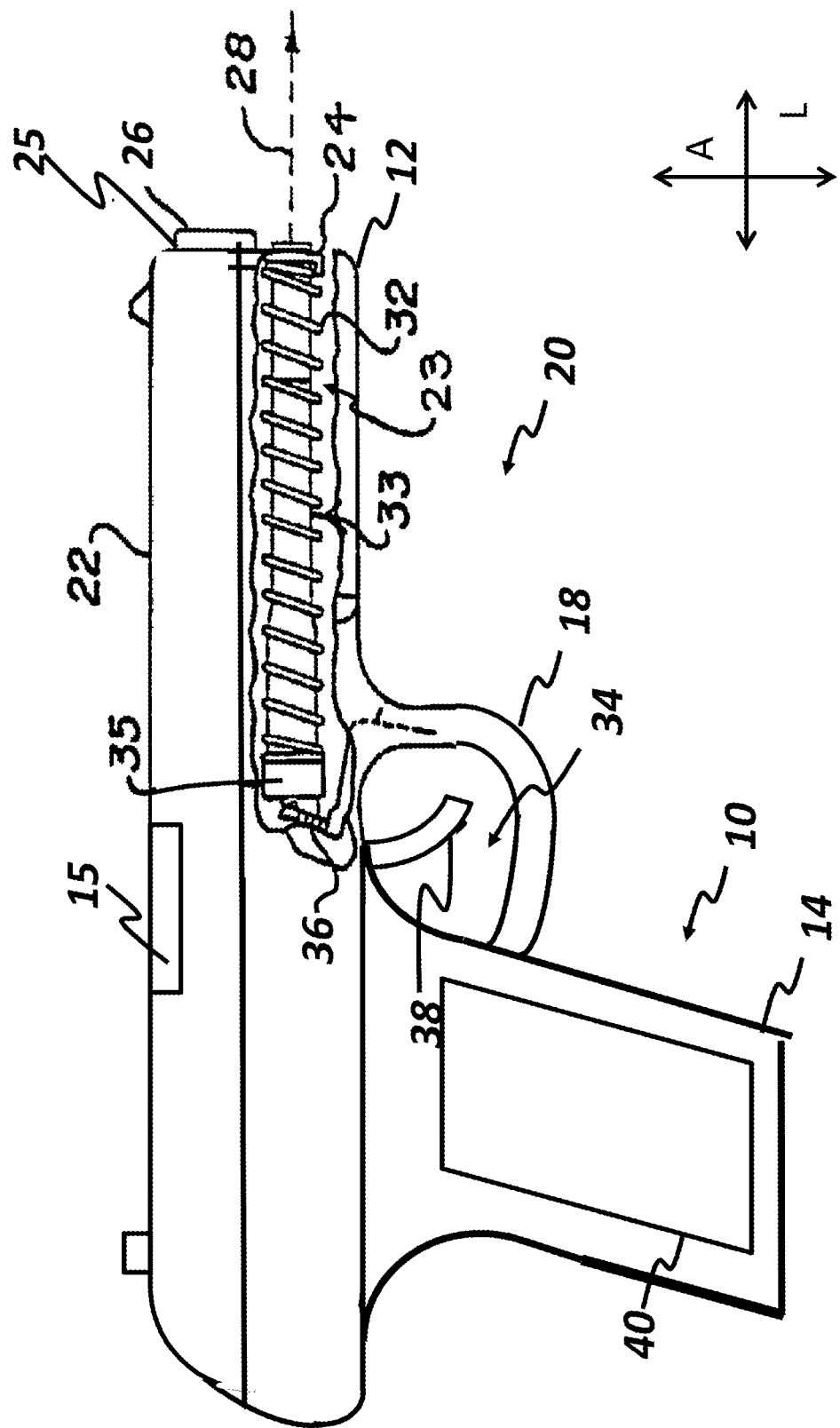
FIG. 1 is a partial cut-away side elevation of one example of a deterrent device.
Figure 4:
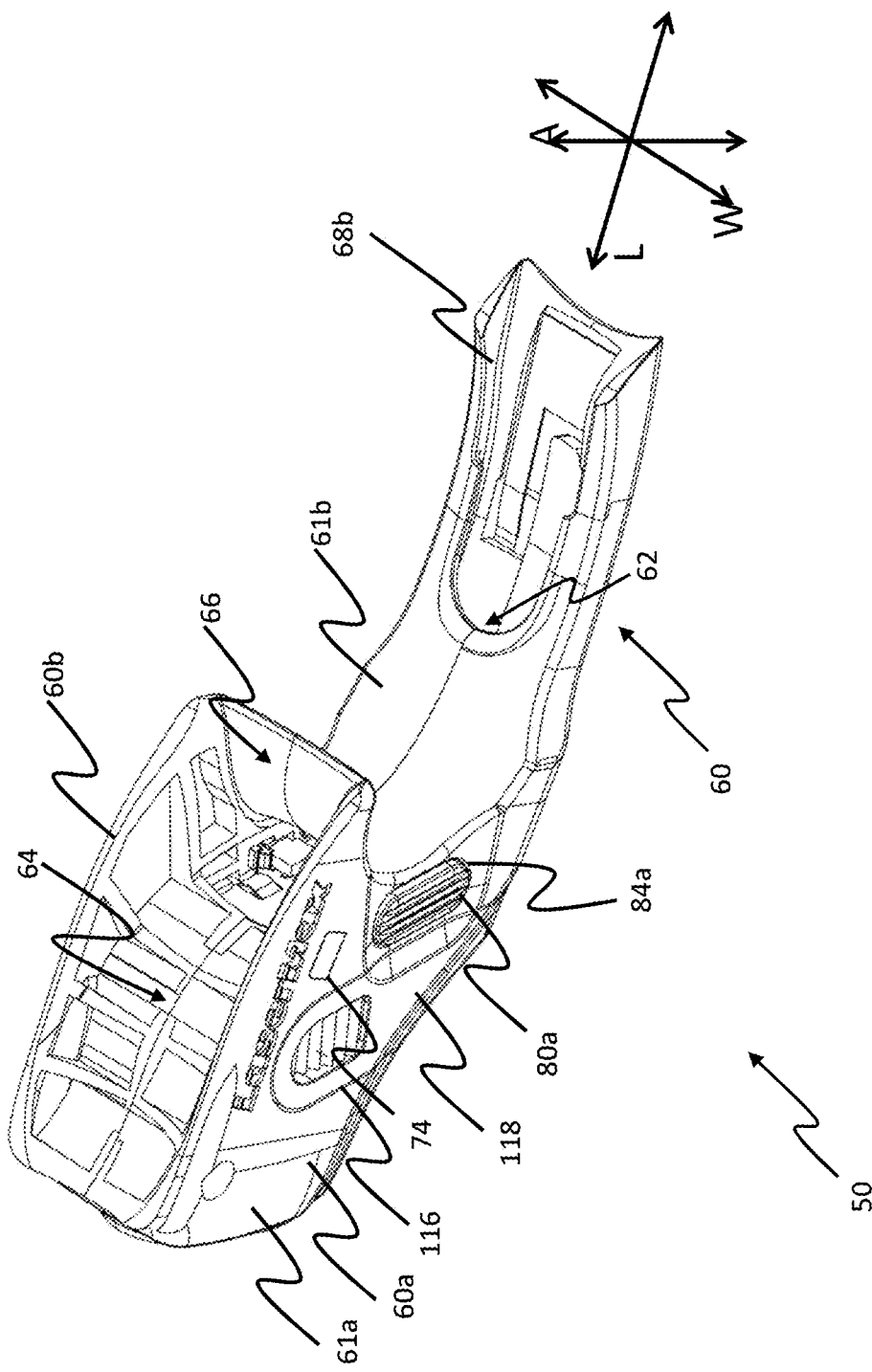
FIG. 4 illustrates an embodiment of an electronic device.
Figure 5:
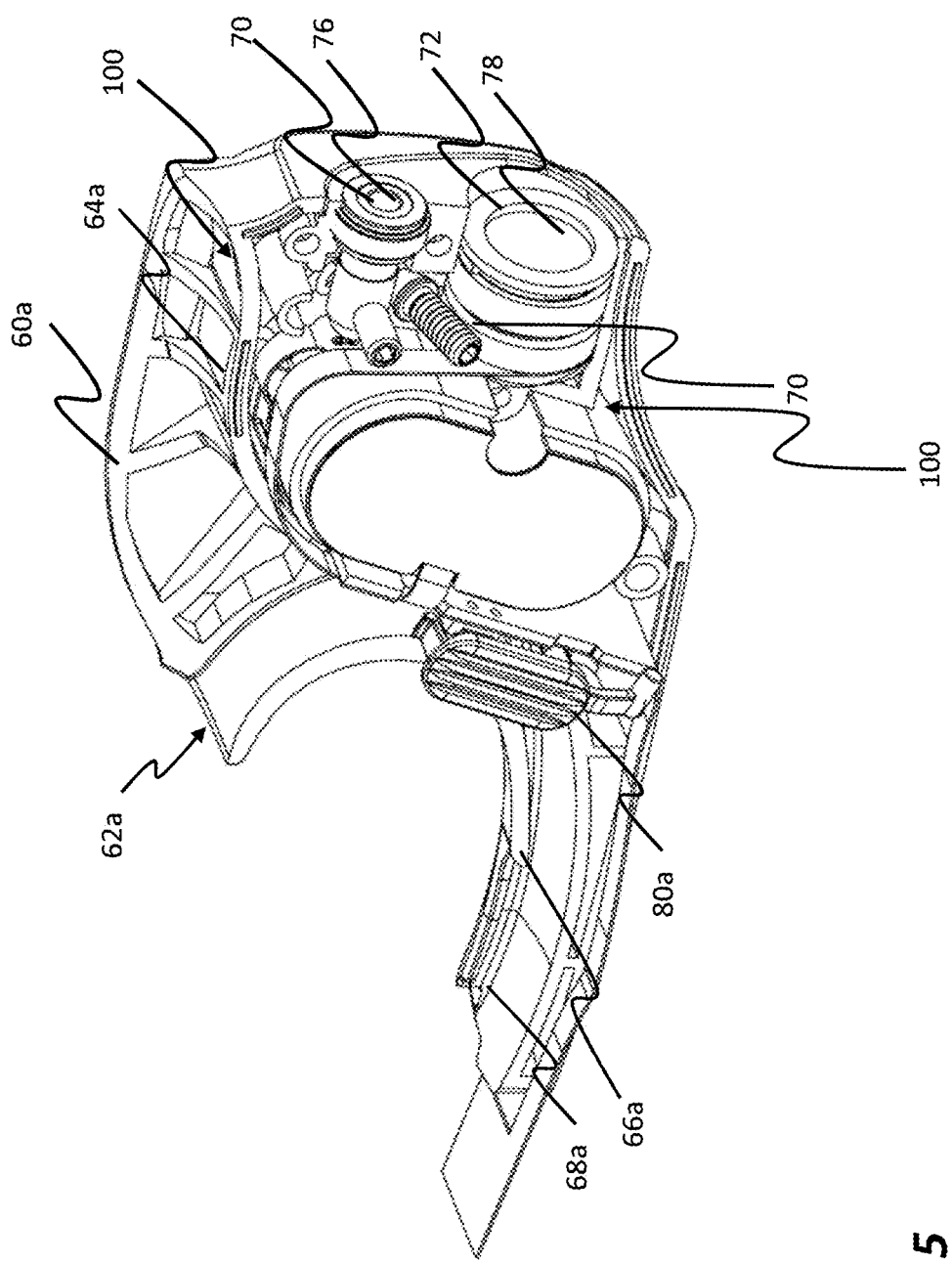
FIG. 5 illustrates the embodiment of Fig. with a second outer surface generally removed from view.
Figure 6:
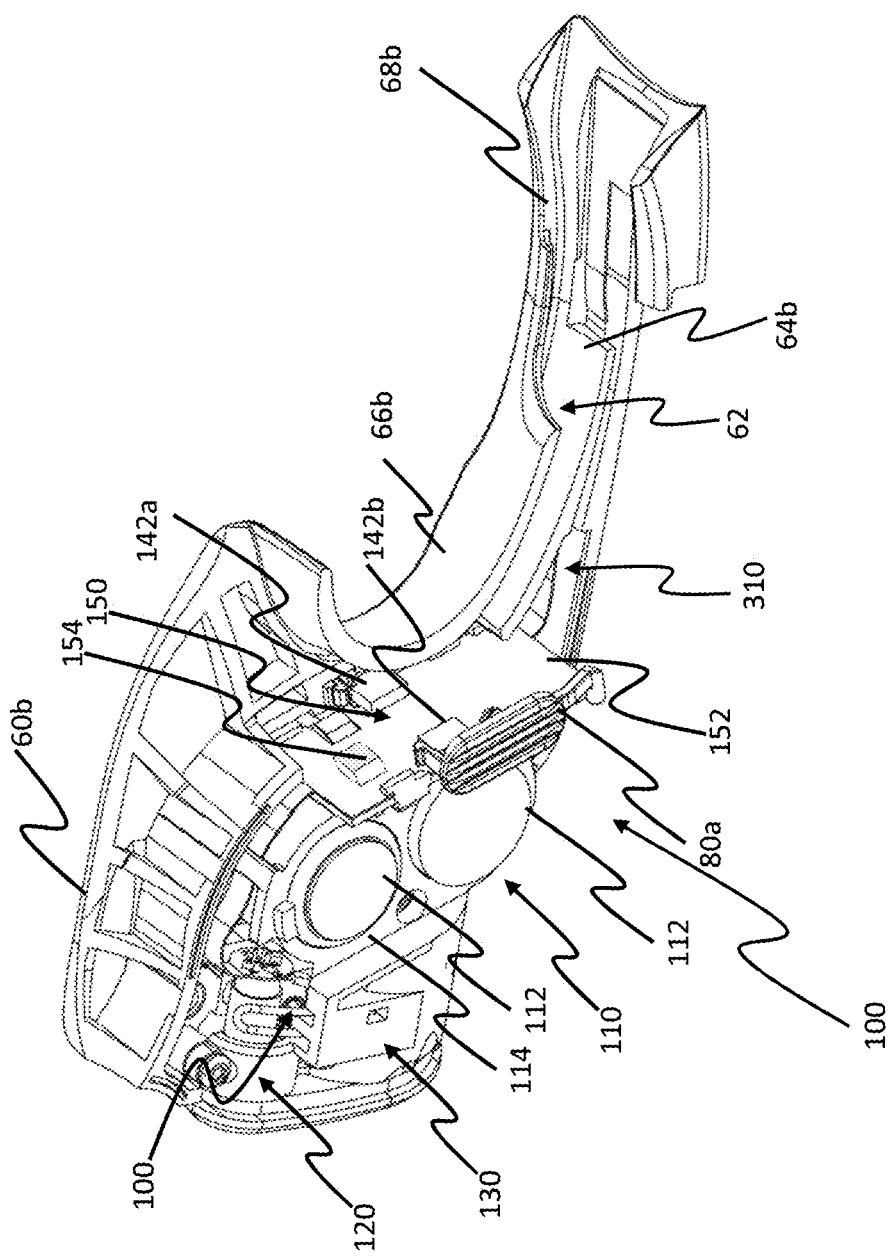
FIG. 6 illustrates the embodiment of FIG. 4 with a first outer surface removed from view.
Figure 7:
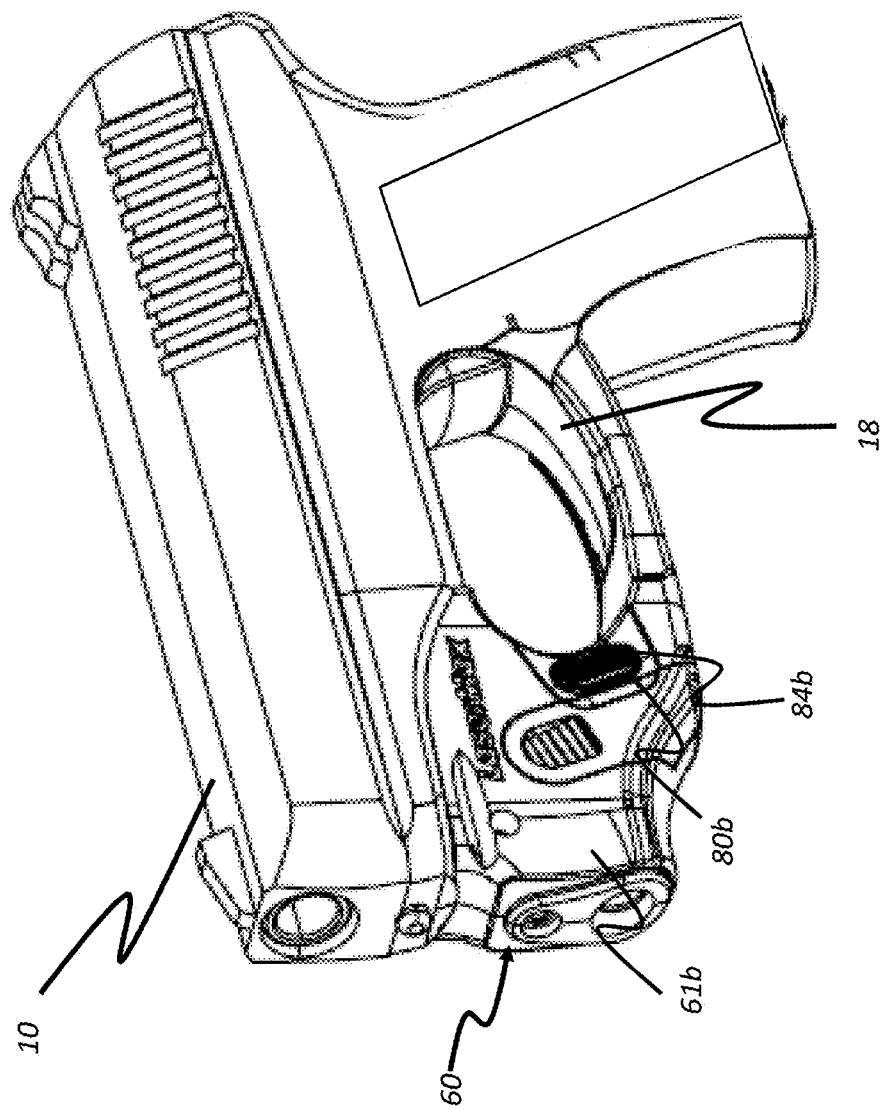
FIG. 7 shows a front, top, left side isometric view of the electronic device of the embodiment of FIG. 4 mounted to a deterrent device.
Figure 8:
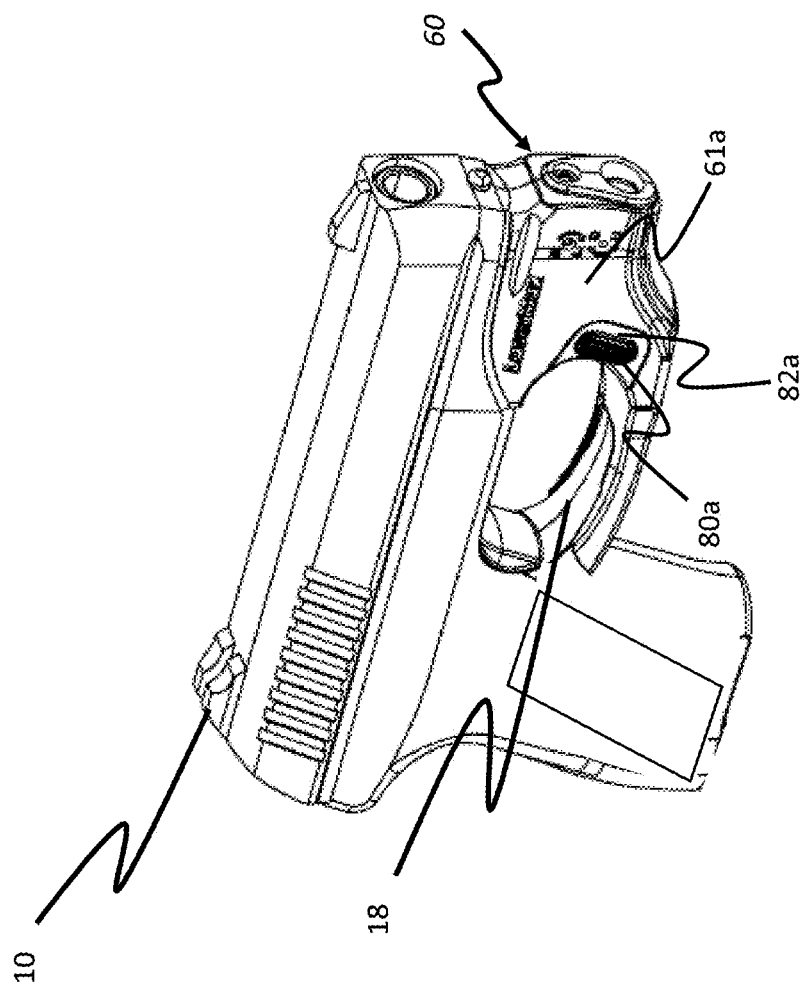
FIG. 8 shows a front, top, right side isometric view of electronic device of the embodiment of FIG. 4 mounted to deterrent device.

FIGS. 1 and 2 illustrate respectively one non-limiting example of a prior art deterrent device 10 taking, in this example, the form of a firearm 10. FIGS. 3A and 3B illustrate, respectively, front and top views of a deterrent device as gripped by a hand 4 of a user. FIGS. 4, 5 and 6 show an embodiment of an electronic device 50 for use with a firearm type of deterrent device 10 and FIGS. 7 and 8 illustrates the embodiment electronic device 50 of FIG. 4 cooperatively mounted to deterrent device 10.

For purposes of description, and unless stated otherwise, the term "longitudinal" L means the dimension along the direction of barrel 25. The term "width" W means the dimension along a direction transverse to an axis of barrel 25. The term "axial" A means the dimension along a direction transverse to the axis of barrel 25. The term "forward" means nearer to or towards a muzzle 26. The term "rearward" means further from or away from the muzzle 26. The term "below" means lower than, in the intended operating orientation of deterrent device 10. The term "above" means higher than, in the intended operating orientation of deterrent device 10. The term "preclude movement" means to substantially preclude movement which would otherwise prevent functioning in an intended manner. The term "angular" means rotating about at least one of the longitudinal and axial directions.

Deterrent device 10 has a deterrence system 20 including which generally can be anything that might present a risk of physical consequences and that might deter an attack. Deterrence system 20 can be a projectile launcher which can be, but is not limited to, a pistol, a rifle, shotgun, revolver or other form of firearm, a cross-bow, a compressed air weapon, a chemical irritant disperser, a non-lethal projectile launcher, or a directed energy weapon such as device that emits a sonic, optical or electrical discharge alone or in combination with a projectile. Such as deterrence system 20 may include any other device that may be likely to cause a person confronted with such a person wielding a deterrent device 10 to be less likely to engage in an aggressive act.

In this embodiment, deterrent device 10 has frame 12 with a grip 14 that holds a magazine (not shown) that contains a number of rounds of ammunition (not shown). The ammunition is spring biased in a direction toward a reciprocating firing chamber 22. Reciprocating firing chamber 22 (also referred to as a slide) is slidably mounted to frame 12. Cartridges from spent rounds are ejected through ejection slot 15 when the reciprocating chamber 22 moves to the left or backward under recoil action following discharge. A barrel 25 extending from the reciprocating chamber 22 is connected to the pistol frame 12 via a take-down latch 36.

Disposed beneath reciprocating chamber 22 is a recoil chamber 23. Within recoil chamber 23 is a recoil spring guide rod 33. A recoil spring 32, guide rod 33, extends between an apertured projection 24 of reciprocating chamber 22 at one end of recoil chamber 23 and an annular seat 35 of guide rod 33 at the other end of recoil chamber 23.

FIG. 2 is a back view of the embodiment of deterrent device 10 of FIG. 1 showing various gripping surfaces. As is shown in FIGS. 1 and 2 deterrent device 10 has a first side grip 40 opposing a second side grip 42, and a rear grip 44 opposite a front grip 46.

FIGS. 3A and 3B illustrate respectively a front and top view of a deterrent device 10 gripped by a right handed user. As is seen here, such a right handed user will wrap a thumb 43 of right hand 4 around side grip 42 and a palm 45 and non-trigger fingers 47 of right hand 4 will wrap against rear grip 44, and side grip 40 and onto front grip 46. For enhanced accuracy, many right handed users are trained to raise their left hand against deterrent device 10 so that a palm of the left hand cups grip 14 and side grip surface 42. It will be appreciated from this that the maintenance of such a two-handed a grip makes it inconvenient to manipulate controls of such an electronic device 50.

Grips 40, 42, 44 and 46 may be at least partially provided with some form of surface relief pattern such as, diamond, stripes, or pyramidal cut patterns illustrated in FIG. 2. These surface relief patterns enhance the ability of a user to grip deterrent device 10 by providing increased friction between deterrent device 10 and the hand(s) of the user. Additionally, such surface relief patterns provide channels into which substances that may be on the hand of the user can flow during gripping of deterrent device 10 so as to allow a clean contact between deterrent device 10 and at least a portion of the hand(s) of the user. Other known grip types and shapes can be used.

Firing of deterrent device 10 is accomplished by inserting a trigger finger 5 into trigger well 34 within a trigger guard 18 and pulling trigger 38 toward rear grip 44. A threshold amount of pull force is required in order to draw trigger 38 to a position where deterrent device 10 discharges. The amount of pull force that is required is set at a level that is sufficient to avoid inadvertent discharge of deterrent device and is typically on the order of around one or more kilograms of pull force.

FIGS. 4-8 illustrate a first embodiment of an electronic device 50. As is shown in FIG. 4, in this embodiment, electronic device 50 is an aiming light and laser combination however this is not limiting except where claimed as such. In this embodiment electronic device 50 has a housing 60 is provided in two mating parts: a first housing portion 60a and a co-designed second housing portion 60b having respectively a first outer surface 61a and a second outer surface 61b respectively. FIG. 5 shows electronic device 50 with second housing portion 60b generally removed from view while FIG. 6 illustrates electronic device 50 with greater detail and with housing portion 60a generally removed from view. FIG. 7 shows a front, top, left side isometric view of electronic device 50 mounted to a deterrent device 10 and FIG. 8 shows a front, top, right side isometric view of electronic device 50 mounted to deterrent device 10.

As is shown in FIGS. 4-8, housing 60 has an engagement portion 62 that is adapted to mechanically associate electronic device 50 with deterrent device 10. In this embodiment, engagement portion 62 has an inner mounting surface 64 and an outer mounting surface 66 that are shaped in a manner that generally conforms to a shape of a trigger guard of deterrent device 10. A first portion 64a of inner mounting surface 64, a first portion 66a of outer mounting surface 66, and a first outer wall 68a are provided by first housing portion 60a while a second portion 64b of inner mounting surface 64, a second portion 66b of outer mounting surface 66, and a second outer wall 68b are provided on by second housing portion 60a. This arrangement allows electronic device 50 to be mechanically associated with firearm 10 by assembling housing portions 60a and 60b with engagement portion 62 positioned about trigger guard 18 and with other components of electronic device 50 positioned therein.

While electronic device 50 is shown as having a housing 60 that mechanically engages trigger guard 18 of firearm 10, this is not limiting. It will be understood that electronic device 50 can be cooperatively engaged with any portion of firearm 10 and may be incorporated into components or elements of firearm 10 including but not limited to frame 12, grip 14, and trigger guard 18 or a slide, barrel, chassis, foregrip or sight. For example and without limitation, housing 60 may engage a mounting rail or any other features on a firearm 10 to which external devices may by mounted. In embodiments engagement portion 62 may comprise a component of deterrent device into which electronic device 50 or a component thereof is joined or integrated. Unless otherwise expressly stated or claimed herein, electronic device 50 is not limited by the function of electronic device 50 or a mechanism used for engaging firearm 10.

It is understood that in other embodiments housing 60 can be formed as a single integral component or from a multitude of interconnected components.

It has been found satisfactory to injection mold housing 60 out of a polymer such as a glass-filled nylon and particularly a nylon 6.6 compound reinforced with 33% glass fiber; suitable for processing by injection molding, wherein the material is lubricated for ease of mold release. However, other materials including but not limited to carbon fiber materials, other plastics, metals such as aluminum, titanium, steel and others ferrous or non-ferrous metals can be used.

Housing 60 holds an electronic system 100 for use with deterrent device 10. Electronic system 100 assists the user of deterrent device 10 when using deterrent device 10. The assistance can take the form of providing any type of electronically controlled assistance or help that may be useful in the operation of deterrent device 10. In embodiments this may take the form of providing aiming assistance, communication, weapon stabilization, targeting information, image enhancement, location information, direction information, shot counting, shots remaining, a targeting reticle, aiming and targeting information, presenting images to the user containing information which may include a visual information including but not limited to a video display such as an LCD, OLED, reflective, emissive, holographic display or a scope with electronic display that presents images in visible wavelengths of light that have been captured in wavelengths of light that are not readily visible to a human eye, such as at ultraviolet, near-infra red, mid-wave infrared and long wave infrared wavelengths of light. In embodiments the assistance may take the form of activating a transponder in the electronic device or providing video or audio communications, capturing images, video and or audio. In still other embodiments, the assistance may take the form of determining and or providing information about the status of the deterrent device such as rounds remaining, safety activation status, and any other information useful in operating deterrent device 10. In further embodiments, the assistance may take the form of pre-activating or activating supplemental deterrent devices such as non-lethal deterrents such as chemical or other deterrent emitters provided in device 10. It will be appreciated that these embodiments are not limiting.

In this embodiment, electronic system 100 provides aiming assistance and illumination and in this embodiment includes a power supply 110, an electronic system 100 including in this embodiment a laser module 120 and an illumination light system 130, a sensor system 140 and a control system 150. In other embodiments electronic system 100 may take other forms including but not limited to image capture devices, holographic sights, heads up displays, scopes and sensor packages including but not limited to sonic sensors, orientation sensors, chemical sensors, electromagnetic field sensors or radiological sensors, or any other kind of portable electronic system of any type or purpose that may be desired to provide to assist a user of a deterrent device 10 in using the deterrent device.

In this embodiment, housing 60 has an opening 70 through which laser light emitted by laser module 120 can exit from housing. Similarly, housing 60 also includes an opening 72 through which light from illumination light system 130 may exit from housing 60. Optionally, housing 60 may have an opening or port 74 with a connector therein that allows optical or electrical signals to be supplied to control system 150 for purposes including but not limited to providing energy to recharge power supply 110 or power to operate electronic device, to communicate with control system 150 during programming or customization operations, or providing data or sensor signals that may be used for purposes including but not limited to integrating operation of electronic device 50 with other electronic devices, communicating with other electronic devices and the like.

Optionally, an optical element 76 may be positioned in opening 70. Optical element 76 can be used to reduce or prevent contaminant from entering into housing 60 through opening 70. In embodiments, optical element 76 may have no optical power or optical element may be used, for example and without limitation, to condition, filter, polarize, aim or to influence an extent of focus, an extent of collimation and/or an extent of divergence of light passing through optical element 76. Similarly, an optical element 78 may be positioned in opening 72. Optical element 78 may be used to reduce or prevent contaminant from entering into housing 60 through opening 72. In embodiments, optical element 78 may have no optical power or optical element may be used, for example and without limitation, to condition, filter, polarize, aim or to influence an extent of focus, an extent of collimation and/or an extent of divergence of light passing through optical element 78.

Power supply 110 can include batteries, either rechargeable or disposable, fuel cells, or other forms of portable energy storage and supply and any circuits or systems or interconnections necessary to provide power to operate laser module 120, illumination light system 130, sensor system 140 and control system 150. In the embodiment illustrated, power supply 110 uses batteries 112 and, optionally, may use power conditioning circuits boost circuit, step up circuits, and step down circuits.

In exemplary embodiments of the present disclosure, power supply 110 may be housed and/or otherwise disposed anywhere where power supply 110 can be reliability positioned relative to housing 60. Power supply 110 may be external to housing 60 as noted above provide power to operate electronic device 50 for example by way of port 74.

In the embodiment illustrated in FIGS. 4-6, power supply 110 has a battery holder shaped to receive batteries 112 within housing part 60b while housing part 60a provides an opening 116 with a door 118 that can be accessed to allow replacement of batteries 112 housing part 60a from electronic device 50.

Laser module 120 includes a laser for selectively emitting a beam of radiation, such as coherent radiation, along an optical axis. Depending on the construction of laser module 120 and housing 60, laser module 120 may provide opening 70 and optical element 76.

It is understood that laser module 120 may be a commercially available assembly and may be operably connected to power supply 110 and control system 150 shown in FIGS. 4-6. In one embodiment laser module 120 may include a red laser at 650 nm with an output power of 3.5 to 5.0 mW when powered by power supply 110 using for example one or more 3 volt lithium batteries. It is understood the laser in the laser module 120 can be any of a variety of lasers such as, but not limited to infrared lasers, lasers emitting at 532 nm; 635 nm or 850 nm.

In an exemplary embodiment, laser module 120 may comprise, for example, one or more of a green laser, a red laser, an infrared laser, an infrared light emitting diode ("LED"), a white and colored LED, a laser having an output of approximately 5 mW (it is understood that lasers having an output greater than approximately 5 mW or less than approximately 5 mW may also be used), and a short wavelength infrared laser ("SWIR"). It is understood that a SWIR may emit a signal, beam, pulse, and/or other radiation having a wavelength of between, approximately 0.9 µm and approximately 2.5 µm. In other embodiments laser module 120 may emit coherent light at other wavelengths including, but not limited to, infrared wavelengths between 2.5 nm and 20 nm and ultraviolet wavelengths below 500 nm and may for example use laser emitters such as CO2 lasers and quantum cascade lasers or ICC lasers to create emissions in these wavelengths.

Illumination light system 130 provides a system with an light emitter and driving circuitry adapted to cause the light emitter to emit a light that may have a greater divergence than the light emitted by laser module 120 so as to provide some ability to perceive the environment around a point where the laser is emitted. Illumination light system 130 may take the form of an incandescent, fluorescent, semiconductor, or organic article or mechanism that emits light when supplied with operating energy and activated by control system 150.

For example, illumination light system 130 may include a light emitting diode that emits, for example, coherent or incoherent light. Such light may be in the visible wavelengths such as between about 390 and 700 nm and it may be outside of such visible wavelengths such that the illumination light must be observed or detected using imagers or detectors appropriate for sensing light in such wavelengths and equipment for converting such light into visible wavelengths that can be observed. Illumination light system 130 may also include other systems such as reflectors to reflect light out of opening 72, optical element 78, thermal management systems such as materials and systems that move heat away from a light emitter to other parts of electronic device 50, into deterrent device 10 or into an environment surrounding electronic device 50.

Sensor system 140 includes any form of device that senses a condition at the electronic device 50 and that provides a signal that can be used in determining operation of electronic device 50. In the embodiment illustrated, sensor system 140 includes for example and without limitation switches 142a and 142b. Switches 142a and 142b are connected respectively to buttons 80a and 80b which are resiliently biased to project through openings 84a and 84b in housing portions 60a and 60b. In operation a user can depress either of buttons 80a and 80b such that one of switches 142a or 142b transitions from a first state to a second state. This change of state can be sensed by control system 150 in making decisions in terms of operating electronic device 50. Sensor system 140 can contain any number of additional sensors, such as light sensors, imagers, chemical sensors, radio frequency or other sensors may also be provided as orientation sensors, accelerometers, thermal sensors, voltage sensors, and any other sensor system that may be useful in electronic device 50. Other forms of user input systems may also be provided in sensor system 140. Sensor system 140 also includes a switchless sensing system 200 that will be described in greater detail below.

Control system 150 is connected to the power supply 110, receives signals from sensor system 140 and determines whether and optionally how laser module 120 and illumination light system 130 are to operate. In the embodiment illustrate control system 150 is shown to include a control board 152 on which components forming a control circuit 154 are provided. Control circuit 154 may have a general purpose processor pre-programmed with instructions in an internal or external memory. Control circuit 154 may also take the form of programmable analog logic device or discrete component systems. In embodiments control circuit 154 may include circuits or systems or customized software for the purpose of driving laser module 120 or illumination light system 130. Such drive circuits may be operable to define duty cycles, intensities, pulse widths, pulse times, pulse shapes of the light or laser emitted by electronic device 50. Either of sensor system 140 or control system 150 may also include drive circuits or programming adapted to drive, poll or otherwise obtain or receive signals from sensor system 140.

Figure 9:
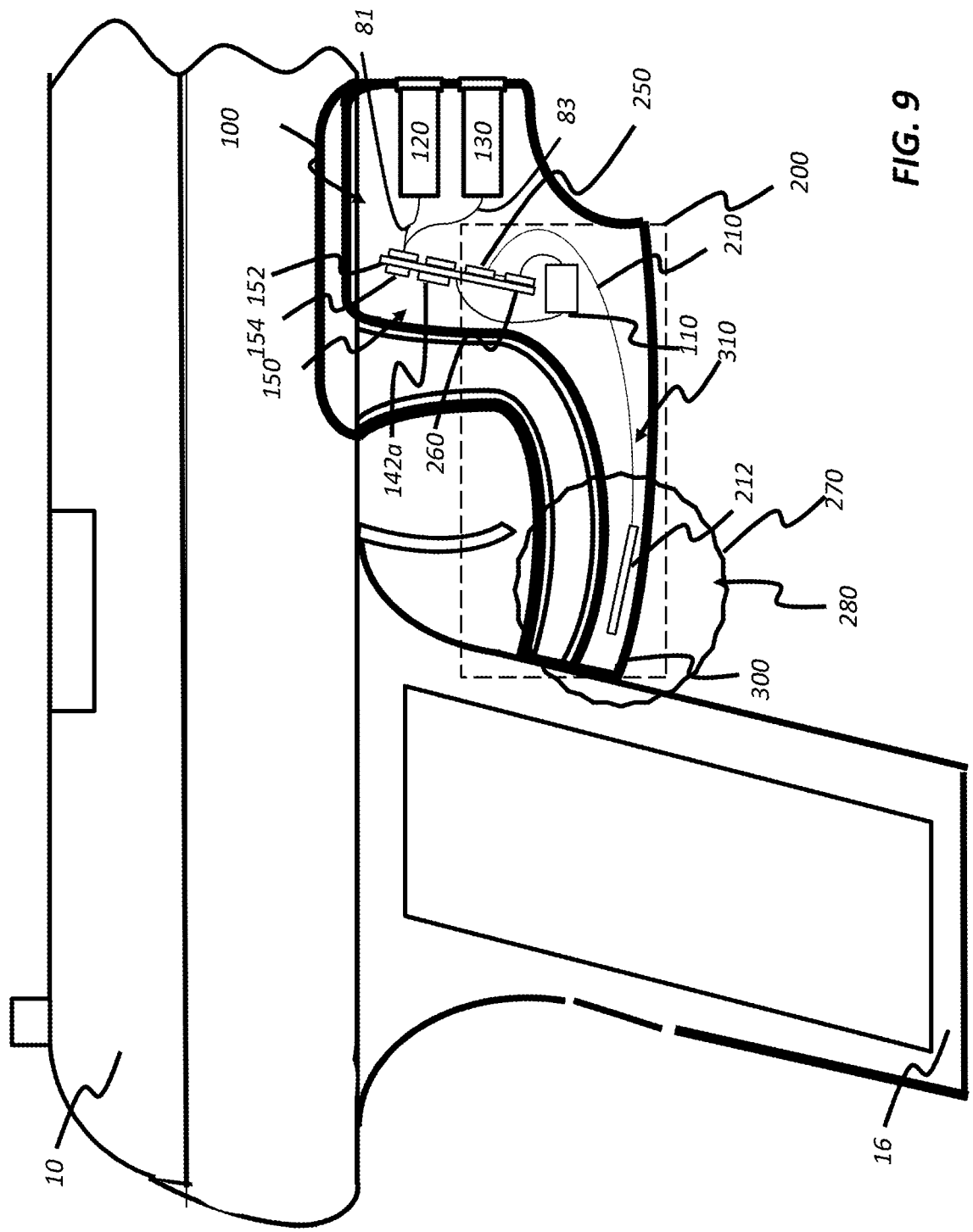
FIG. 9 shows a side view of a deterrent device with an embodiment of an electronic device joined thereto having one embodiment of a switchless sensing system with a sensing space.

Turning now to FIG. 9 what is shown is a side view of a deterrent device 10 with an embodiment of electronic device 50 mounted thereto to illustrate one embodiment of the operation of an electronic device 50 having a switchless sensing system 200. In the embodiment of FIG. 9, switchless sensing system 200 includes a housing 60 that is associated with deterrent device 10 and that positions a first conductive surface 212 relative to a sensing space 280.

An insulator 300 is positioned between first conductive surface 212 and sensing space 280. In general, insulator 300 prevents objects and materials from making electrically conductive contact with first conductive surface 212. In this embodiment insulator 300 comprises a portion of housing 60 and provides physical barrier that blocks movement of finger 6 or other matter toward first conductive surface 212 at a position that is separated from first conductive surface 212. In other embodiments, insulator 300 can permit physical contact between finger 6 or other matter while preventing electrical conduction with first conductive surface.

An excitation source 250 and a capacitance sensing circuit 260 are connected to first conductive surface 212 optionally by way of a first conductor 210. During capacitance measurements, excitation source 250 is used to create a time varying electric field 270 at first conductive surface 212 while capacitance sensing system 260 is used to measure capacitance between first conductive surface 212 and capacitance sensing system 260. In FIG. 9 and elsewhere herein, the time varying electric field 270 is conceptually illustrated as extending in all directions about first conductive surface 212 and is shown as having a generally consistent size. The perimeter illustrated is intended to be suggestive of a perimeter of electric field 270 beyond which an intensity of the electric field 270 drops below a predetermined threshold level. As electric field 270 is time varying during measurements such a perimeter may be larger or smaller at different times.

First conductive surface 212, capacitive sensing system 260 and insulator 300 are arranged relative to each other, such as by being at positioned, sized, shaped or arranged relative so that when excitation source 250 causes electric field 270 about first conductive surface 212, first conductive surface 212 extends through insulator 300 to create sensing space 280 where a hand or other body part of a user of deterrent device 10 is expected to be positioned when gripping or otherwise using deterrent device 10. In this embodiment, sensing space 280 is positioned proximate to grip 14 of deterrent device 10 and sized so that at least one finger 6 a hand 4 of a user gripping deterrent device grip 14 will be positioned within sensing space 280.

Figure 10:
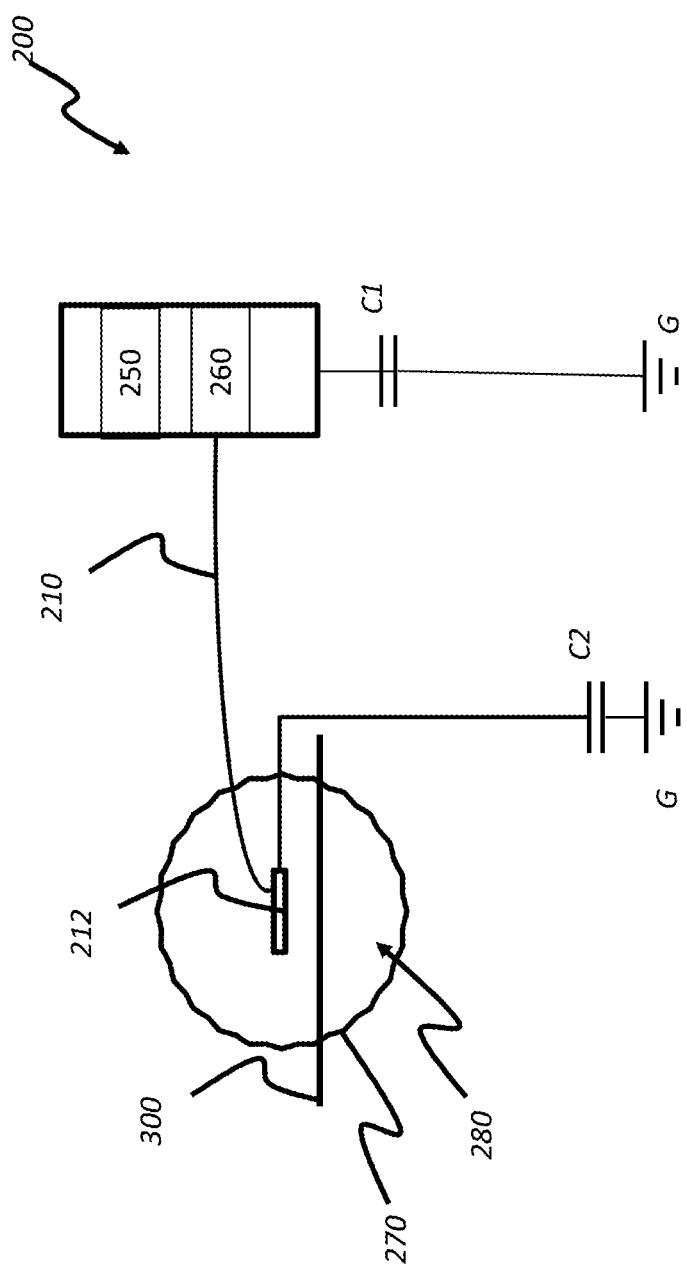
FIG. 10 shows a capacitance model of the embodiment of switchless sensing system of FIG. 9.

FIG. 10 provides a model for understanding the measurement of capacitance by capacitance sensing system 260. In this model, excitation source 250 and capacitance sensing circuit 260 can be understood to have a capacitance C1 relative to a ground G such as earth ground. In the model of FIG. 10 first conductive surface 212 similarly can also be understood to have a capacitance relative to ground G shown in FIG. 10 as C2. Additionally, ground G can be understood conceptually to serve to complete a circuit including excitation source 250, first conductive surface 212, a capacitor having the circuitry capacitance C2, through circuit capacitance C1 to capacitance sensing circuit 260. Accordingly, a capacitance measured by capacitance sensing circuit 260 can be approximated by the following equation:

$$C_t = \frac{1}{\frac{1}{C1} + \frac{1}{C2}}$$

In this model, $C_t$ is the total capacitance measured, C1 is a capacitance between capacitance sensing circuit 260 and ground G and C2 is a capacitance between first conductive surface 212 and ground G.

Figure 11:
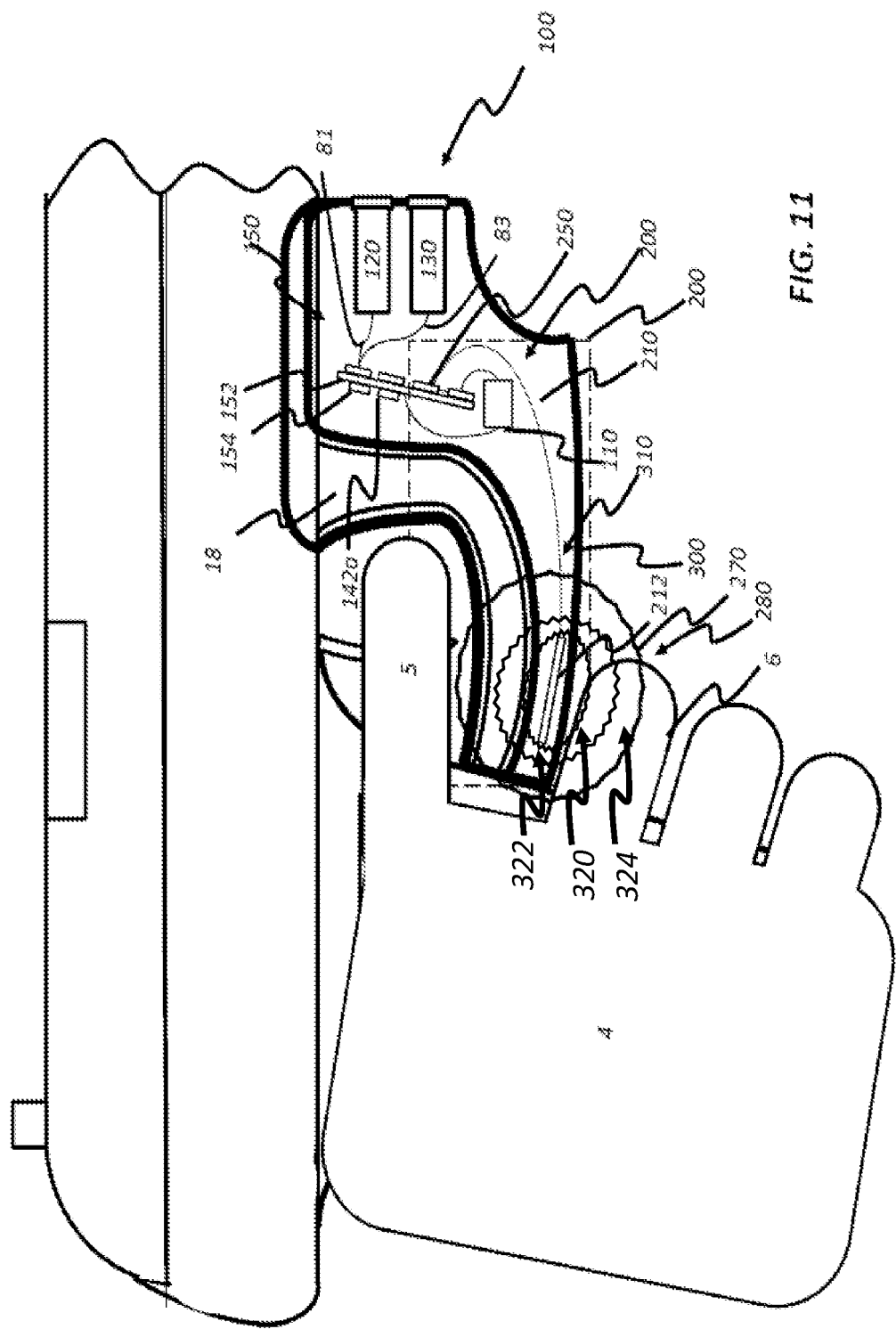
FIG. 11 shows a view of a side of the deterrent device and electronic device shown in FIG. 9 and gripped by a hand.

As is shown in FIG. 11, when deterrent device 10 is gripped by a hand 4 of a user, a trigger finger 5 is positioned adjacent the trigger guard 18 and a finger 6 wraps around and under trigger guard 18 proximate to insulator 300, bringing at least finger 6 into sensing space 280.

Figure 12:
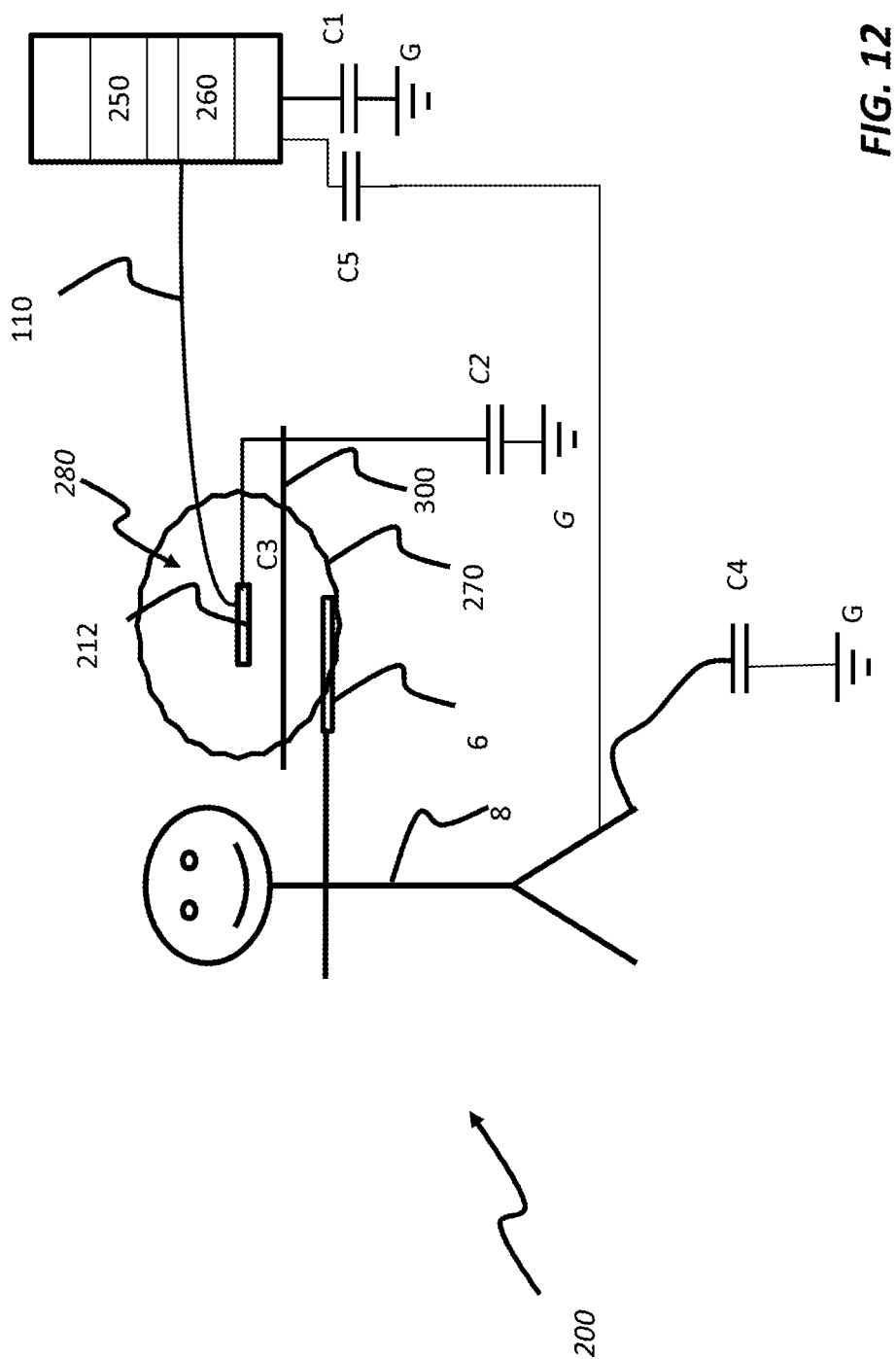
FIG. 12 shows a capacitance model of the embodiment of FIG. 9 with a hand in the sensing space.

As is shown in FIG. 12, the human body is a relatively good conductor and provides an additional path to ground G that includes, in series, a capacitance formed between first conductive surface 212 and finger 6 shown here as C3 and a capacitance between body 8 of the user and ground G shown here as C4. Additionally, there will be a capacitance between body 8 and capacitive sensing circuit 260 that is shown here as C5.

The total capacitance measured $C_t$ in this model principally therefore is a measure of these five capacitors in series and parallel therefore the total capacitance can be approximated by:

$$Ct = \frac{1}{\frac{1}{C1} + \frac{1}{C2}} + \frac{1}{\frac{1}{C3} + \frac{1}{\frac{1}{\frac{1}{C4} + \frac{1}{C1}} + C5}}$$

It will be appreciated from this that the introduction of a finger creates additional capacitances as capacitances C3, C4 and C5 that cause a measurement of the circuit including first conductive surface 212 to be different than a measurement made at a time when no finger is present and only capacitances C1 and C2 are present, this is particularly true in that capacitances C3 and C4 are typically substantially higher than C1 and C2.

The capacitance measurement can be made using a number of methods. In one embodiment, excitation source 250 uses a current source to apply time varying current to first conductive surface 212 to create a difference of potential or voltage across the circuit between first conductive surface 212 and other electrically connected components of switchless sensing system 200 and any other components electrically connected thereto. A capacitance is determined by capacitance sensing circuit 260 based on a change in the voltage that results from the applied current over time.

In another embodiment, excitation source 250 uses a voltage source to apply time varying voltage to first conductive surface 212 to induce current flow in the circuit between first conductive surface 212 and other electrically connected components of switchless sensing system 200 and any other components electrically connected thereto. A capacitance is determined by capacitance sensing circuit 260 based on a change in the current that results from the applied voltage over time.

In embodiments, excitation source 250 may supply current or voltage using a sinusoidal, ramp, saw-tooth, or other periodic wave pattern or any other time varying pattern.

In embodiments, excitation source 250 may charge first conductive surface 212 through a known impedance, for example and without limitation, through a 10M Ω resistor that is connected to a voltage source while capacitance sensing circuit 260 determines how much time it takes for the supplied charge to create a predetermined voltage between first conductive surface 212 and the circuit. In one example, this voltage may comprise a fraction of an applied voltage such as between 40 and 66.6% of the applied voltage. In embodiments, an amount of time required for an amount of current being supplied by excitation source 250 to charge first conductive surface 212 as the voltage between first conductive surface 212 and ground G ramps up toward a predetermined voltage may also be used as in indication of the capacitance. In embodiments, other methods for measuring capacitance or conditions indicative of capacitance may be used by capacitance sensing circuit 260.

In the event that deterrent device 10 and associated electronic device 50 are holstered or otherwise stored when not in use, the holster material or material in areas surrounding switchless sensing system 200 may provide capacitances that are substantially different than those sensed when deterrent device 10 and associated electronic device 50 are holstered or stored. Here too, for example, it is possible to discriminate between the presence of a finger in sensing space 280 and the presence of a holster material in sensing space 280 in that common holster materials such as leather, fabrics and plastic materials such as nylon, polyester, polycarbonates, and other synthetics will not provide the same impact on a measured capacitance as a finger will provide. Similarly it may be possible to discriminate between the presence of a finger in sensing space 280 and other materials proximate to deterrent device 20 and electronic device 50 when stored.

In view of this, capacitance measured by capacitance sensing circuit 260 will be substantially different when a human finger is present in sensing space 280 than when no human finger is present and that by providing capacitance signal indicative of the sensed capacitance, capacitance sensing circuit 260 enables control system 150 to make decisions about activation or control of deterrent device 10 without the need for a switch to sense the presence of a finger and without the complications and problems that flow from such switching.

Control system 150 receives the capacitance measure signal from capacitance sensing circuit 260 and determines whether the signal is indicative of a capacitance value that is within a range of values that is associated with the presence of a finger in sensing space 280. When the signal is within the range of values associated with finger presence, control system 150 can activate electronic system 100 which, in this embodiment, involves activating laser module 120 and illumination light system 130. In operation control system 150 can for example and without limitation cause switchless sensing system 200 to sense periodically, the capacitance between first conductive surface 212 and control circuit 260 for example and without limitation at a rate about between 0.02 and 2 seconds. In embodiments, the sensing period can change dynamically, such as where a more frequent sampling is done during periods of activation.

Alternatively, control system 150 can use a comparison function, comparing a currently read signal or an average of several currently read signals to immediate past signals or an average of many past signals and can determine when to activate or take other control actions based upon a relative change in capacitance from an initial state to a second state. Additionally activation or control determinative functions or algorithms may be used to detect patterns of changes in capacitance that are indicative of activation or other control behavior. So called artificial intelligence algorithms may also be applied by control system 150 to capacitive signals received by control system 150 to determine whether a finger is present in sensing space 280.

In embodiments, control system 150 can be adapted to receive information for use in determining thresholds, functions or other data useful in making activation or other control decisions. For example, as noted above, storage conditions for different uses of a deterrent device may vary widely. Some deterrent devices may be stored indoors in gun safes or the like for long periods of time until needed for example to deter a home invasion and control system 150 while others may be carried in external holsters and exposed to the elements. The capacitive characteristics sensed in each type of storage may be different. In embodiments, control system 150 stores data that helps to characterize storage conditions so that more accurate discrimination between a holstered or stored condition and a grasped or use condition can be made. In embodiments, control system can automatically measure capacitance when deterrent device 10 and associated electronic device 50 are not in use such as when deterrent device 10 is in storage and can associate certain capacitance measurements with storage conditions. This association can be used to adjust comparison modes, thresholds, functions, algorithms or other decision making logic. Similarly, control system 150 can use measurements of capacitances made during use of deterrent device 10 and an associated electronic device 150 as well as capacitance measurements made during known transitions to refine modes, thresholds, functions, algorithms or other decision making logic to particular circumstances. In this way, it becomes possible for control system 150 to better adapt predetermined algorithms so that more accurate activation and de-activation and other decisions regarding operation are made.

When control system 150 determines that a finger is present in sensing space 280, control system 150 can activate or take other control actions relative to electronic system 100. In the embodiment of FIGS. 9-12, activation of laser module 120 and illumination light system 130 is performed and in this embodiment control system 150 is illustrated being connected to laser module 120 and illumination light system 130 by way of electrical connections 81 and 83 which act to simultaneously activate both laser module 120 and illumination light system 130. This is optional, and as is illustrated elsewhere herein, electrical connectors 81 and 83 provide separate electrical paths that enable individual control of laser module 120 and illumination light system 130.

In embodiments, electronic device 50 may have an switchless sensing system 200 that includes first conductive surface 212 and one or more additional first conductive surfaces. Such an additional first conductive surface may be connected to excitation source 250 and capacitance sensing system 260 so that it can be used in creating an additional electric field and an additional sensing space which may be positioned apart from a sensing space 270 associated with first conductive surface 270 when excited by excitation source 250. In such embodiments, capacitive sensing system 260 is adapted to measure capacitance between such an additional conductive surface and capacitive sensing system 260. Control system 150 can be the adapted to control operation of electronic system 100 based upon at least one of the capacitance measured in the sensing space and any capacitance measured in any additional sensing space.

Figure 13:
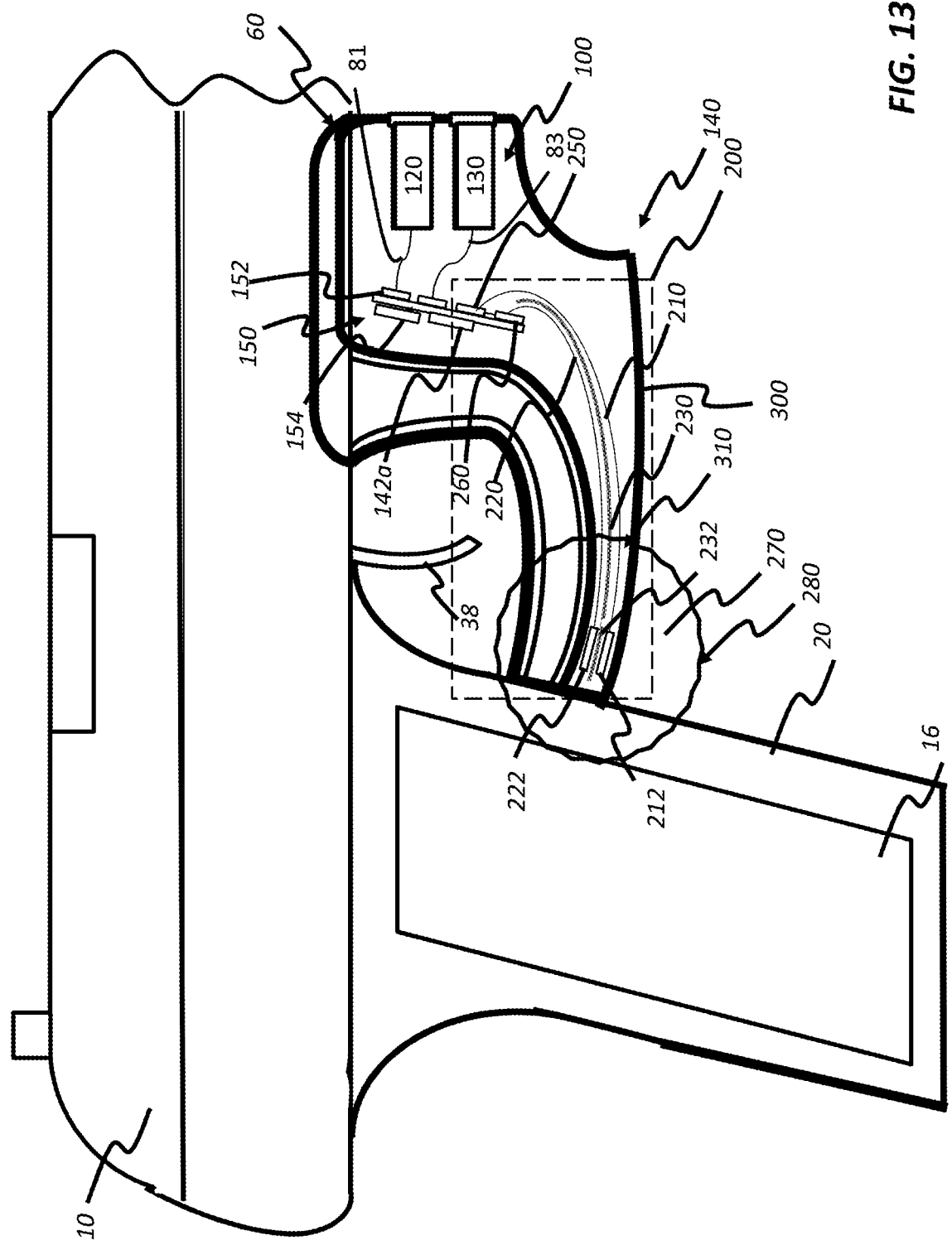
FIG. 13 shows a side view of a deterrent device with an embodiment of an electronic device joined thereto having another embodiment of a switchless sensing system with a sensing space.

FIG. 13 shows a side view of a deterrent device 10 with an embodiment of an electronic device 50 joined thereto having another embodiment of a switchless sensing system 200 with a sensing space 280. As is illustrated in FIG. 13, in this embodiment switchless sensing system 200 has a first conductive surface 212 and a second conductive surface 222. First conductor 210 and a second conductor 220 are positioned by housing 60 and are maintained in a spaced relation relative to each other and have an electrically insulative material such as insulative material 230 therebetween. As is also shown in FIG. 13, first conductor 210 is electrically connected to first conductive surface 212 and second conductor 220 is electrically connected to second conductive surface 222.

Conductive surfaces 212 and 222 are positioned generally proximate to and may be generally in parallel with each other and are separated by an electrically insulative material 232. Such an insulative material 232 may be the same as or different than insulative material 230 and may comprise, for example, materials characterized as electrical insulators. Insulative materials having predetermined dielectric properties and resisitive properties may be used for insulative material that is positioned between first conductive surface 212 and second conductive surface 222. In general, it is preferred that insulative material 230 preclude meaningful conductive flow of charge from first conductive surface 212 to second conductive surface 222.

In this embodiment, first conductor 210, second conductor 220, insulative material 230, first conductive surface 212, second conductive surface 222 and insulative material 232 are arranged so that a capacitance measured between first conductor 210 and second conductor 220 is defined principally by the capacitance between first conductive surface 212 and second conductive surface 222 with any parasitic or other capacitance between first conductor 210 and second conductor 220 being minimized to the extent that is possible and practicable. Accordingly, for the purpose of FIG. 13, (and in other embodiments herein) discussion of parasitic capacitance between first conductor 210 and second conductor 220 will be omitted.

As is shown in FIG. 13, in this embodiment, switchless sensing system 200 has an excitation source 250 that is electrically connected to first conductor 210 and to second conductor 220 by way of a capacitance sensing circuit 260.

In operation, excitation source 250 periodically creates a difference of potential between first conductive surface 212 and second conductive surface 222.

First conductive surface 212 and second conductive surface 222 are shaped and spaced so that when excitation source 250 generates a difference of potential between first conductive surface 212 and second conductive surface 222 an electric field 270 forms. Electric field 270 includes a direct field directly between first conductive surface 212 and second conductive surface 222 (not shown) and an electric field 270 extending between first conductive surface 212 and second conductive surface 222 in directions other than directly between first conductive surface 212 and second conductive surface 222.

In operation, a capacitance measurement indicative of a capacitance between conductive surface 212 and second conductive surface 222 is made when excitation source 250 creates a changing electric field between first conductive surface 212 and second conductive surface 222 and capacitive sensing system measures the induced current, which can be done using methods described above for example.

Figure 14:
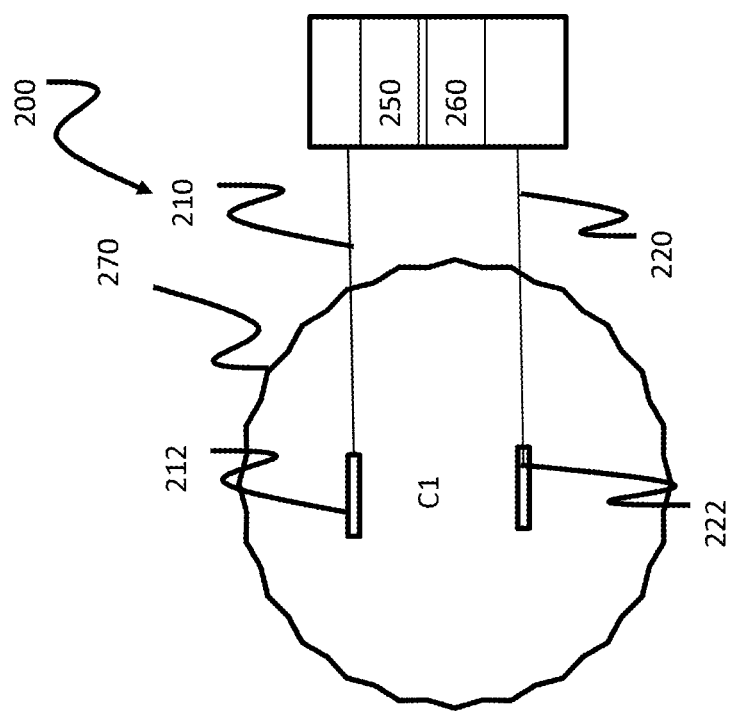
FIG. 14 shows a capacitance model of the embodiment of switchless sensing system of FIG. 13.

FIG. 14 provides a model for understanding the capacitance measured by capacitive sensing circuit 260. In this embodiment, excitation source 250 and capacitance sensing circuit 260 can be understood to be a part of a circuit including first conductor 210, first conductive surface 212, second conductor 220 and second conductive surface 222 and in this embodiment the total measured capacitance Ct will generally equal a capacitance C1 between first conductive surface 212 and second conductive surface 222.

Capacitance C1 between first conductive surface 212 and second conductive surface 222 is dependent on many factors, including the shapes of first conductive surface 212 and second conductive surface 222, an extent of separation between first conductive surface 212 and second conductive surface 222 and the dielectric properties of the space between and surrounding first conductive surface 212 and second conductive surface 222. In general, assuming a parallel plate model of capacitance, total capacitance between first conductive surface 212 and second conductive surface 222 increases with the area of the plates such as the area of first conductive surface 212 and second conductive surface 222, and decreases to the extent of separation between first conductive surface 212 and the second conductive surface 222. Additionally capacitance is proportional to the permittivity of the material between first conductive surface 212 and second conductive surface 222.

In the embodiment of FIG. 13 mutual capacitance attributable to direct fields will be based in part on the dielectric properties of the materials in the space between first conductive surface 212 and second conductive surface 222. In FIG. 13, this space is illustrated as being completely occupied by insulative material 232. Accordingly, the contribution of direct fields to the mutual capacitance between first conductive surface 212 and second conductive surface 222 in this embodiment, this does not change substantially and accordingly the direct capacitance will fall within a generally predictable range over time.

However, in this embodiment electric fields which extend through spaces other than the space directly between first conductive surface 212 and second conductive surface 222 may pass through a number of different materials each having different dielectric, conductive and capacitive properties each having the potential to influence the electric field and the total capacitance measured between first conductive surface 212 and second conductive surface 222.

As is shown in FIG. 13, in this embodiment, switchless sensing system 200 has an excitation source 250 that is electrically connected to first conductor 210 and to second conductor 220 by way of a capacitance sensing circuit 260. For example, as is shown in the FIG. 13, electric fields 270 pass through areas of space near first conductive surface that include many different materials with different dielectric properties, such as, portions of housing 60 and insulative material 230, trigger guard 18. Here too, the dielectric properties of housing 60, insulative material 230, trigger guard 18 and any other materials through which electric fields pass may influence the capacitance measured between first conductive surface 212 and second conductive surface 222.

Additionally, as is also shown in FIG. 13 electric field 270 passes through insulator 300 into areas adjacent to the exterior of deterrent device 10 or housing 60 such as sensing space 280 which in FIG. 13 is shown having air within.

Accordingly, where deterrent device 10 and electronic device 50 are mechanically associated as is illustrated in FIG. 13, a measured capacitance between first conductive surface 212 and second conductive surface 222 will be determined based upon the dielectric properties of housing 60, insulative material 230, trigger guard 18, and whatever material is in sensing space 280.

In general, dielectric properties of trigger guard 18, housing 60, and insulative material 230, and/or deterrent device 10 will remain generally constant or within predetermined ranges over time and their respective contributions to overall capacitance measured between first conductive surface 212 and second conductive surface 222 will remain within these predetermined ranges over time.

However, sensing space 280 is outside of housing 60 and accordingly materials present in sensing space 280 may change and such changes can interact with electric field 270 in ways that have a pronounced impact on the total capacitance Ct of a circuit including first conductive surface 212 and second conductive surface 222. Such a change may be particularly pronounced when a conductive object is inserted into sensing space 280 and interacts with electric field 270 to impact the total capacitance Ct measured in a circuit that includes first conductive surface 212 and second conductive surface 222.

Figure 15:
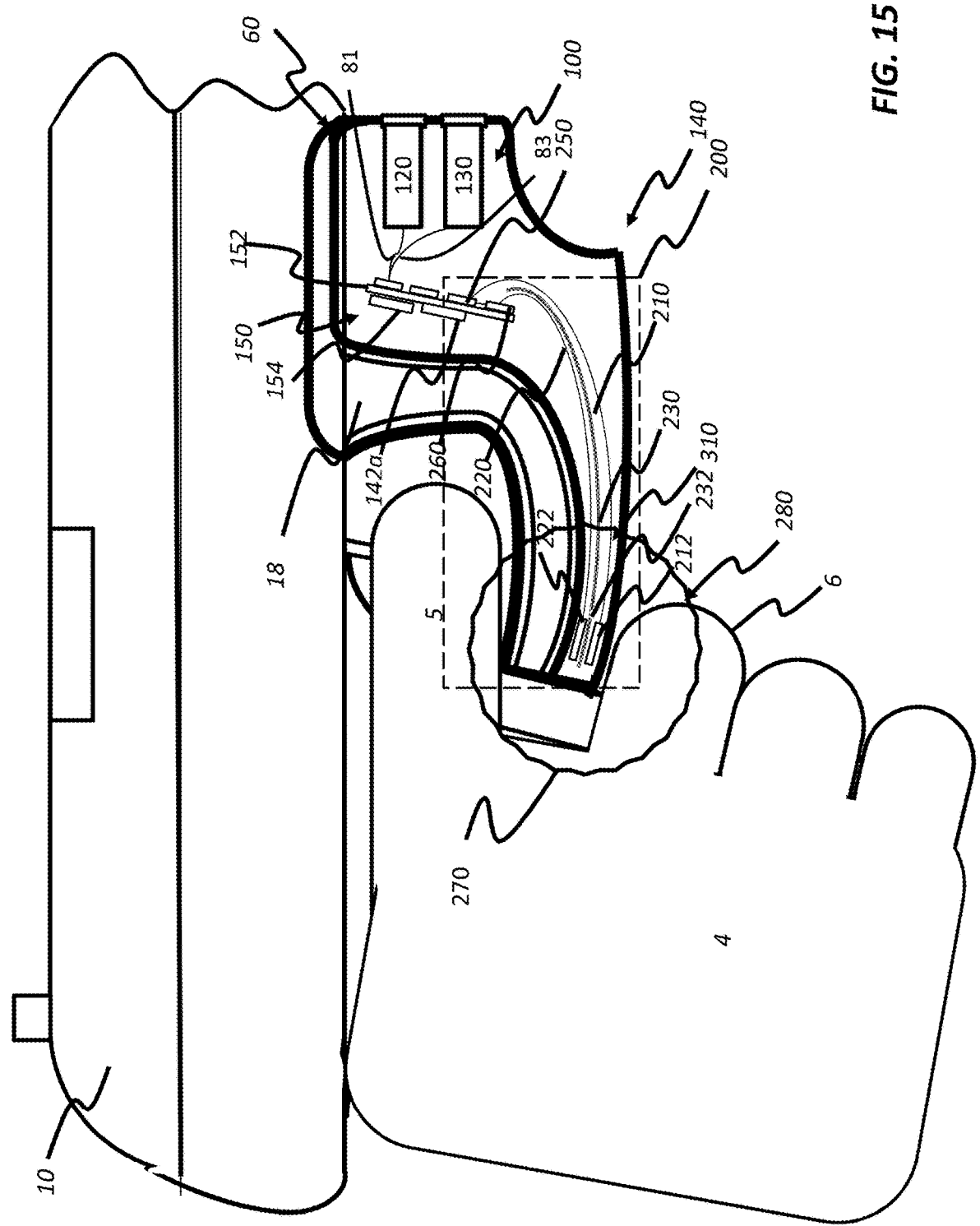
FIG. 15 shows a view of a side of the deterrent device and electronic device shown in FIG. 13 and gripped by a hand.

For example, as is shown in FIG. 15, when deterrent device 10 is gripped by a hand 4 of a user, a trigger finger 5 is positioned adjacent to trigger guard 18 and a finger 6 wraps around and under trigger guard 18 and insulator 300, bringing finger 6 into sensing space 280. Finger 6 is a conductor that electrically interacts with electric field 270.

Figure 16:
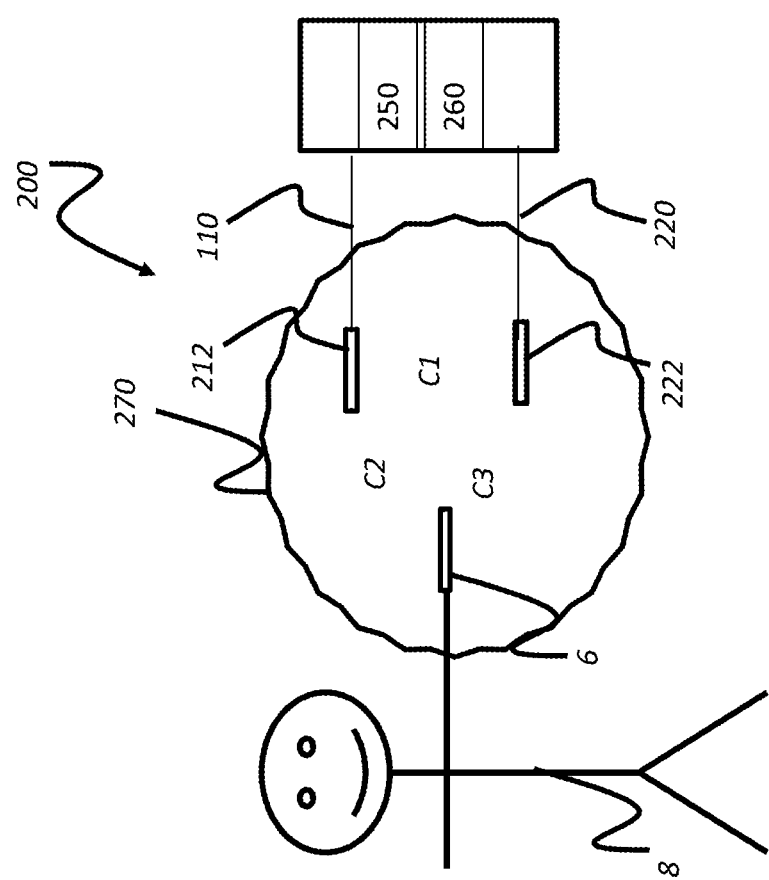
FIG. 16 shows a capacitance model of the embodiment of FIG. 13 with a hand in the sensing space.

FIG. 16 shows a model of this interaction. In this model the human finger acts as third conductive surface and can be modeled as creating a first-conductive-surface-to-finger capacitor C2 and a second-conductive-surface-to-finger capacitor C3 that are in parallel with capacitor C1. Accordingly, a total capacitance measured $C_t$ for a circuit that includes first conductive surface 212 and second conductive surface 222 when a finger 6 is present includes two capacitors not found in the circuit when finger 6 is not present—a capacitor C2 between first conductive surface 212 and finger 6 and a capacitor C3 between second conductive surface 212 and finger 6 such that the total measured capacitance is modeled as:

$$C_t = C1 + \frac{1}{\frac{1}{C2} + \frac{1}{C3}}$$

In this model Ct is the total measured capacitance, C2 is the capacitance between first conductive surface 212 and finger 6, and C3 is the capacitance between second conductive surface 212 and finger 6.

In operation, this embodiment of switchless sensing circuit 200 has a capacitance sensing circuit 260 that generates a capacitance signal indicative of the capacitance sensed. Control system 150 receives the capacitance signal from capacitance sensing circuit 260 and determines whether the signal is indicative of a capacitance value that is within a range of values that is associated with the presence of a finger in sensing space 280. When the signal is within the range of values associated with finger presence, control system 150 can activate electronic system 100 which, in this embodiment, involves activating laser module 120 and illumination light system 130.

Control system 150 can for example and without limitation cause switchless sensing system 200 to sense periodically, the capacitance between first conductive surface 212 and second conductive surface 222 for example at a rate about between 0.02 and 2 seconds. In embodiments, switchless sensing system 200 can, for example, have a local controller (not shown in FIG. 15) that is adapted to periodically sense capacitance optionally excitation source 250 and capacitance sensing circuit 260 can be adapted to periodically sense capacitance.

The shape and size of sensing space 280 can be defined in various ways. For example, a sensing space 280 can have a length determined in part by a length of the first conductive surface 212, a length of the second conductive surface 222, and any lengthwise separation between first conductive surface 212 and second conductive surface 222. Similarly sensing space 280 can have a width determined in part by a width of the first conductive surface 212, a width of the second conductive surface 222, and any widthwise separation between first conductive surface 212 and second conductive surface 222. A depth of sensing space 280 may also be determined by a proximity of first conductive surface to insulator 300 or other portions of housing 60 separating first conductive surface 212 from sensing space 280. Additionally, the length, width and depth of sensing space 280 can be determined in part based upon an intensity of the excitation signal.

In embodiments more than one first conductive surface 212 or more than one pair of first conductive surfaces and second conductive surfaces can be provided proximate to sensing space 280 to provide redundant sensing capability, to provide spatial resolution of sensing within sensing space 280, to shape sensing space 280, to extend the volume of sensing space 280, or to enable, for example, additional functionality. Optionally, additional paired ones of second conductive surface 222 may be provided for each of first conductive surface 212 or a single second conductive surface 222 may be used.

In embodiments first conductive surface 212 and second conductive surface 222 may be positioned so that the electric field extends predominantly to one side of electronic device 50. This may be used to prevent false activations that might arise in cases where deterrent device 10 is positioned too closely to other parts of a human body during holstering or transport. This approach is optional.

Figure 17:
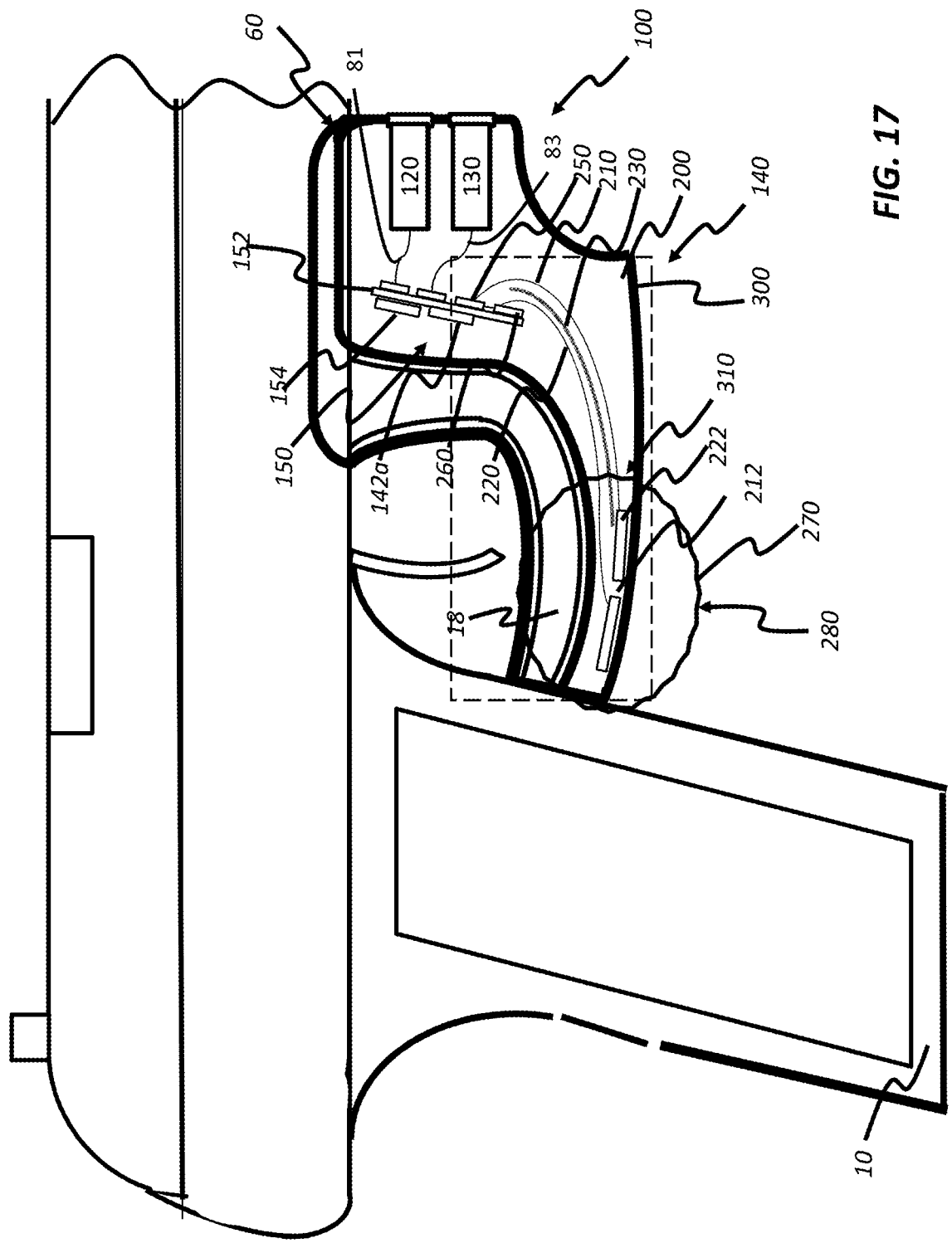
FIG. 17 shows a side view of a deterrent device with another embodiment of an electronic device joined thereto having another embodiment of a switchless sensing system with a sensing space.

FIG. 17 illustrates another embodiment of electronic device 50 having another embodiment of an activation sensing system 200. In this embodiment first conductive surface 212 and second conductive surface 222 are arranged in a manner that is separated longitudinally such that direct capacitance is present to the comparatively limited extent that it exists along adjacent edges of first conductive surface 212 and second conductive surface 222 while other electric fields extend in other directions between first conductive surface 212 and second conductive surface 222 however excitation source 250 and capacitance sensing circuit 260 are connected to these in a similar as described in the embodiment of FIGS. 13-16. This approach has can be used to create an electric field 270 with characteristics that are different than those of the electric field of FIGS. 13-16. In general, this longitudinal separation of first conductive surface 212 and second conductive surface 222 may have the effect of creating an electric field 270 with a different shape than the preceding embodiment. Additionally, this arrangement may and allows a greater portion of the sensitivity of capacitance sensing circuit 260 to be dedicated sensing changes in the total measured capacitance caused by the intrusion of a finger or other part of a human hand into sensing space 280 by limiting the extent to which direct fields between first conductive surface 212 and second conductive surface 222 contribute to capacitance measured in a circuit including first conductive surface 212 and second conductive surface 222.

In this embodiment, first conductive surface 212 and second conductive surface 222 are formed and positioned, and switchless sensing system 200 is operated so that electric field 270 extends through insulator 300 into sensing space 280 and so that sensing space 280 is positioned such that when a user naturally grasps deterrent device 10, a finger 6 or other portion a hand 4 is positioned in sensing space 280 as is shown in FIG. 17.

Figure 18:
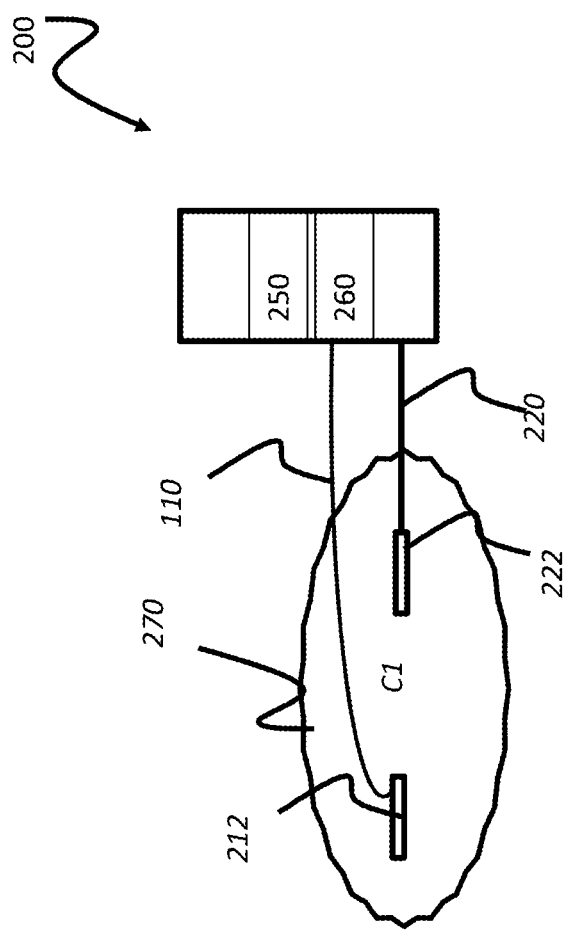
FIG. 18 shows a capacitance model of the embodiment of switchless sensing system of FIG. 17.

As is shown in FIG. 18, in general the total measured capacitance Ct between first conductive surface 212 and second conductive surface 222 in the circumstances depicted in FIGS. 9 and 10 will be equal to the capacitance C1 between first conductive surface 212 and second conductive surface 222.

Figure 19:
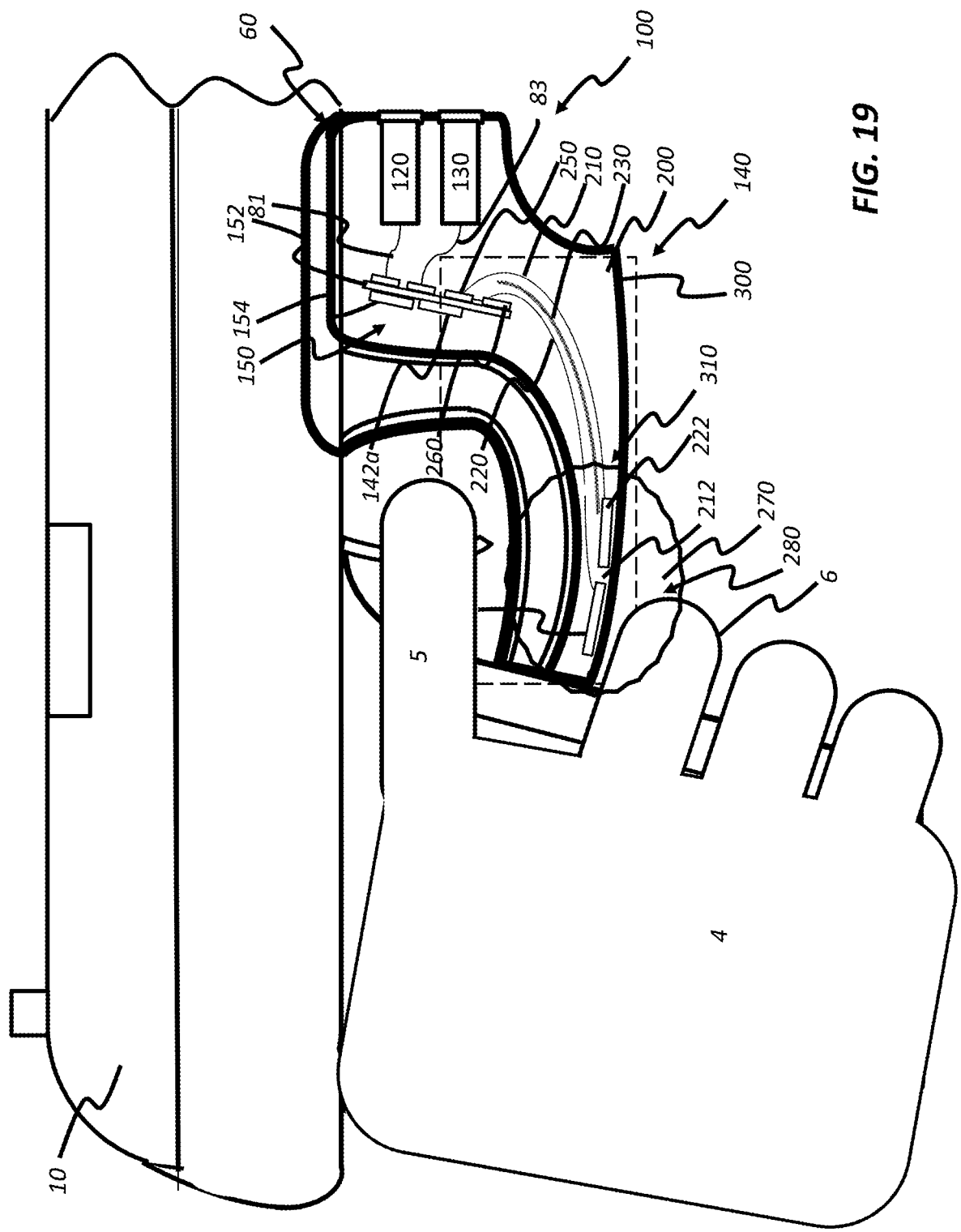
FIG. 19 shows a view of a side of the deterrent device and electronic device shown in FIG. 17 and gripped by a hand.

As is shown in FIG. 19, when deterrent device 10 is gripped by a hand 4 of a user, a trigger finger 5 is positioned adjacent the trigger guard 18 and a finger 6 wraps around grip 14 under trigger guard 18 and proximate to insulator 300, bringing finger 6 into sensing space 280 where conductive finger 6 interacts with electric field 270.

Figure 20:
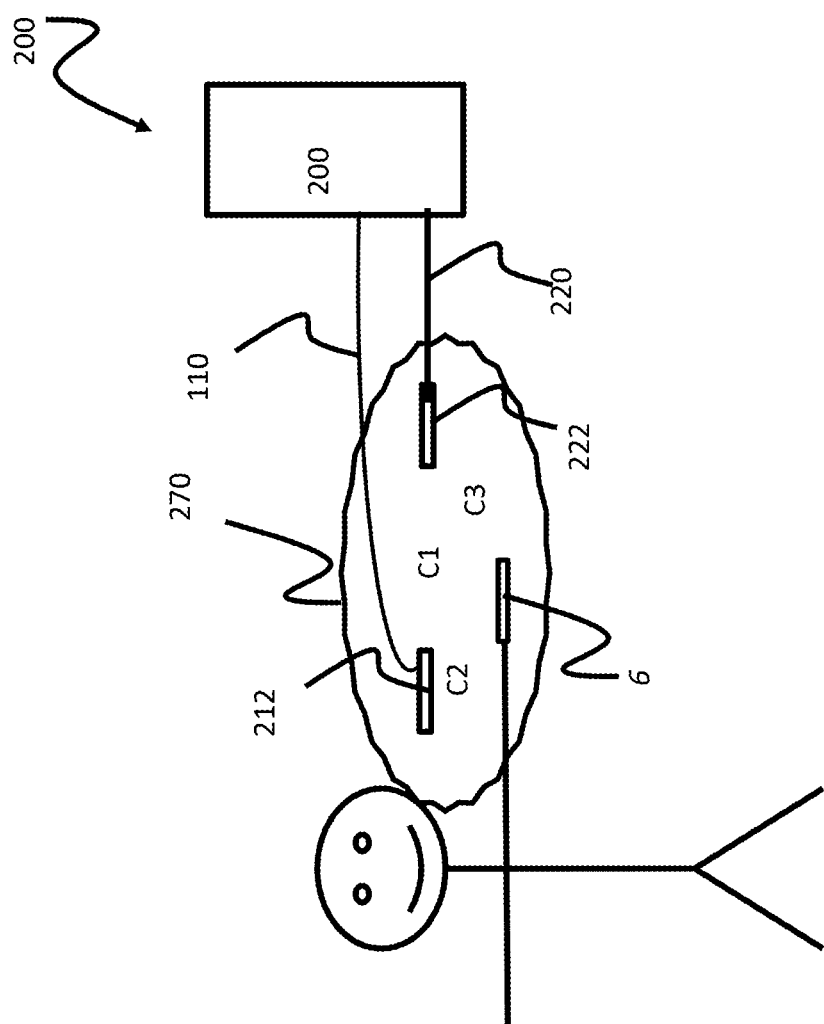
FIG. 20 shows a capacitance model of the embodiment of FIG. 17 with a hand in the sensing space.
Figure 21:
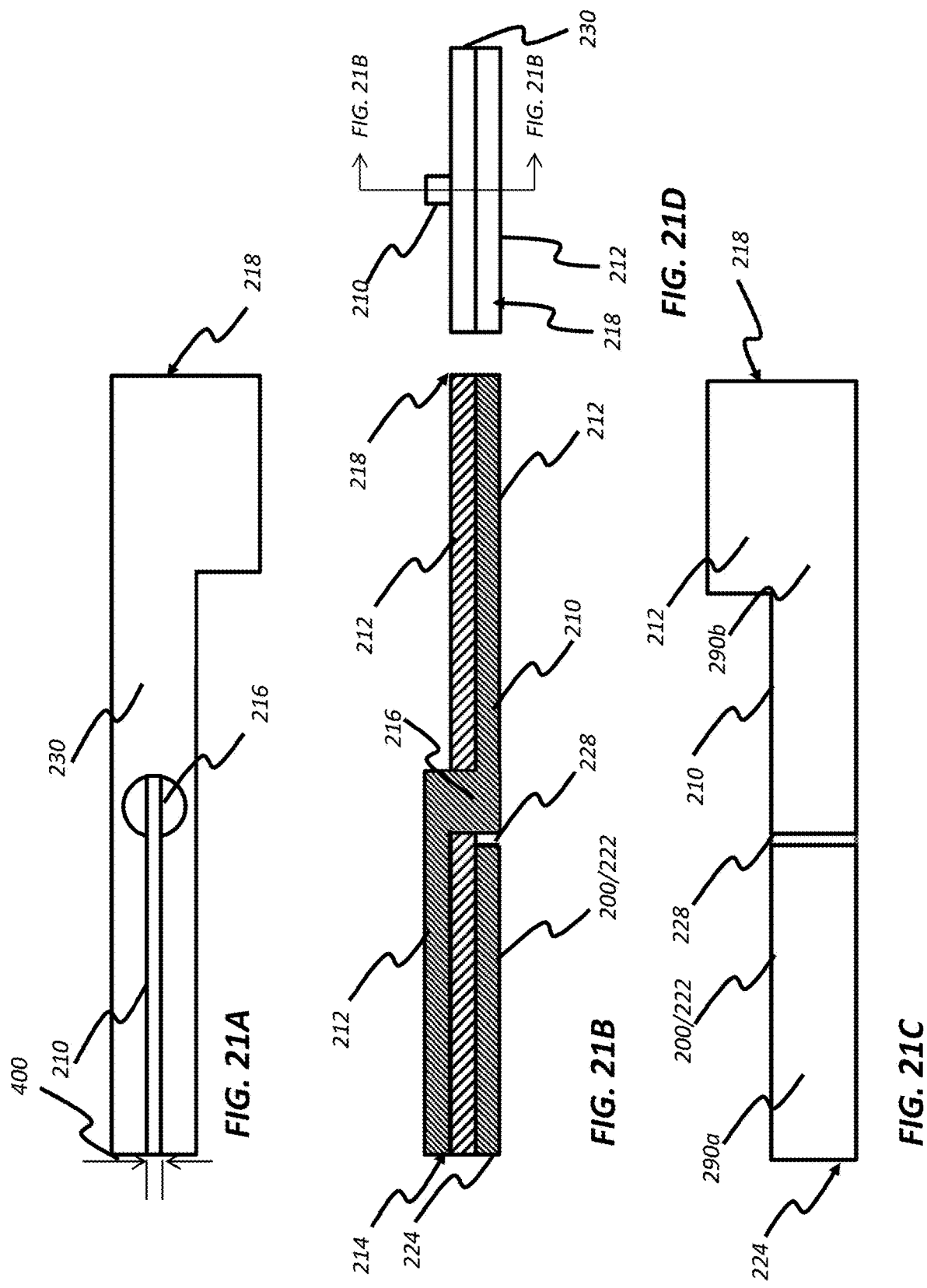
FIGS. 21A, 21B, 21C and 21D illustrate respectively top, side cross section, bottom and a pad end elevation views of one embodiment of a first conductor, first conductive surface, second conductor and second conductive surface formed using an insulative material which in this embodiment is a flexible film.

FIG. 20 shows a model of this interaction. In this model the human finger acts as third conductive surface and can be modeled as creating a first-conductive-surface-to-finger capacitor C2 and a second-conductive-surface-to-finger capacitor C3 that are in parallel with capacitor C1. Accordingly, a total capacitance measured $C_t$ for a circuit that includes first conductive surface 212 and second conductive surface 222 when a finger 6 is present includes two capacitors not found in the circuit when finger 6 is not present—a capacitor C2 between first conductive surface 212 and finger 6 and a capacitor C3 between second conductive surface 212 and finger 6 such that the total measured capacitance is modeled as:

$$C_t = C1 + \frac{1}{\frac{1}{C2} + \frac{1}{C3}}$$

In this model Ct is the total measured capacitance, C2 is the capacitance between first conductive surface 212 and finger 6, and C3 is the capacitance between second conductive surface 212 and finger 6.

Here again, there will be a significant difference between the total measured capacitance Ct where the capacitance is determined only based upon capacitor C1 and when the capacitance is based upon capacitors C1, C2 and C3. Control system 150 can use these differences to determine an activation or other control function for electronic system 100.

In the above embodiments, it will be appreciated that housing 60 has a insulator 300 that in these embodiments is positioned by housing 60 to be separate from inner wall 66. Here insulator 300 is shown as a solid wall however in other embodiments there are other possibilities. Between inner wall 66 and insulator 300, is a conductor pathway 310 that extends in part between excitation source 250, capacitance sensing system 260 and a portion of pathway 310 that is proximate to sensing space 280. Insulator 300 in this embodiment prevents physical contact between a hand 4, or finger 6 of a user and first conductive surface 212 and second conductive surface 222 so that no part of a hand (or any other body part) can create an electrical short between first conductive surface 212 and second conductive surface 222. Insulator 300 can also be provided in a manner that substantially prevents water, or any other thing from making an electrical short between first conductive surface and second conductive surface. In embodiments, first conductive surface 212 and second conductive surface 222 can be overcoated with a sealant or be formed within a protective encasement to protect or to further protect against materials, objects or contaminants causing or enabling an electrical short between first conductive surface 212 and second conductive surface 222.

Figure 22:
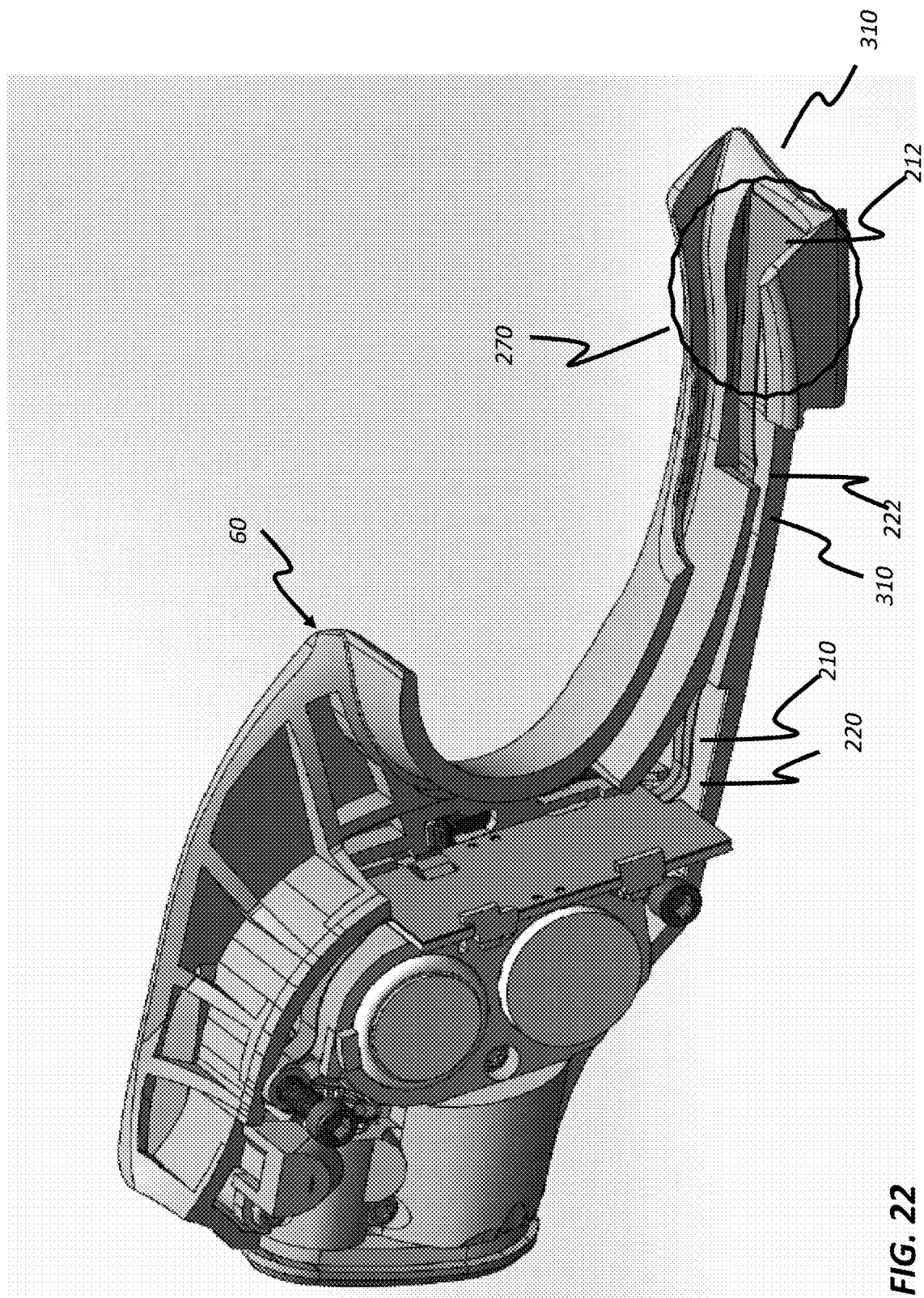
FIG. 22 is a back, left side top isometric view of an embodiment of an electronic device having the embodiment of FIGS. 21A, 21B, 21C and 21D.

FIGS. 21A, 21B, 21C and 21D illustrate respectively top, side cross section, bottom and a pad end elevation view of one embodiment of a first conductor 210, first conductive surface 212, second conductor 220 and second conductive surface 222 formed using an insulative material 230 which in this embodiment is a flexible film 230. As is shown in this embodiment, a first conductor 210 extends along a top surface of insulative material 230 from a connection end 214 to a via 216, through via 216 to first conductive surface 212. Similarly a second conductor 220 extends along a bottom surface of insulative material 230 from a connection end 214 to a gap 228 that electrically insulates second conductor 220 from first conductor 210. Gap 228 can comprise an air gap or gap 228 can be filled with an insulative material to generally prevent an electrical short across gap 228. FIG. 22 illustrates one example of the embodiment of first conductor 210, first conductive surface 212, second conductor 220 and second conductive surface 222 formed using an insulative material 230 and installed within a pathway 310.

The embodiment of FIGS. 21A-21D and in FIG. 22, can in one embodiment be stamped in a pattern using a film of insulative material 230 having a single conductor 290 on a bottom side. Where this is done, via 216 can be etched or cut through insulative material 230 to expose a top surface of the bottom conductor and gap 228 can be etched, cut, or otherwise removed to separate single conductor 290 into a first portion 290a and a second portion 290b. Gap 228 can optionally filled with an insulative material or allowed to stand as an air gap to electrically insulate a first portion 290a extending generally from connection end 224 from a second portion 290b extending from gap 228 to generally a pad end 218. First conductor 210 can then be formed on an upper surface of insulative material 230 from a connection end 214 through via 216 and into an electrical connection with a top surface of second portion 290b. In this embodiment first portion 290a forms second conductor 220 and second conductive surface 222 while second portion 290b forms at least first conductive surface 212 and optionally may form at least a part of first conductor 210. In this way a single shaped conductor/insulator film or sheet can be used to form a first conductor 210, first conductive surface 212, second conductor 220 and second conductive surface 222.

Optionally the embodiment of FIGS. 21A-21D and FIG. 22 can also be used to provide only a first conductive surface 212 such as may be useful in the embodiments described with reference to FIGS. 9-12.

It will be appreciated that in other embodiments one or more of first conductor 210, second conductor 220, first conductive surface 212 and second conductive surface 222 can be any conductive component of a deterrent device including for example a trigger guard, slide lock, trigger, handle, frame, rail, barrel, slide or any other electrically conductive component of deterrent device 10 and can include combinations of conductive components including but limited to consumables and packaging for consumables used in deterrent device 10.

For example and without limitation, an electronic device 50 may be incorporated within a guide rod 33 that is mechanically connected to one or more components of a pistol or other type of deterrent device 10 using such a guide rod. In still other embodiments, housing 60 may in part comprise a component of or be positioned within or on a deterrent device 10 that is gripped by a user during operation, including but not limited grips, foregrips, forearms, magazines, frames and handles.

Figures 23A, 23B:
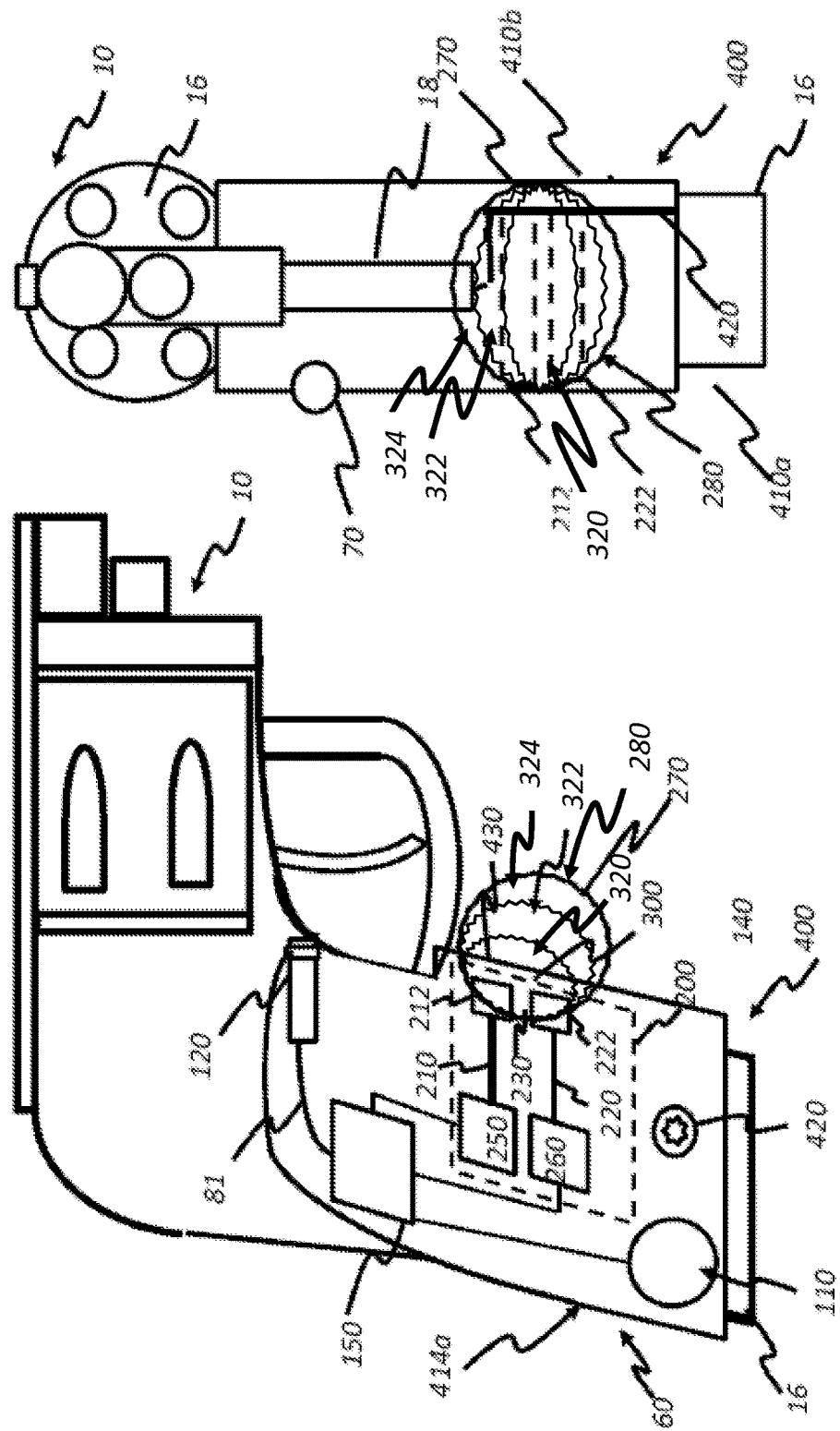
FIGS. 23A and 23B illustrate an embodiment of an electronic device having a switchless sensing system incorporated into a grip of a deterrent device.

For example FIGS. 23A and 23B illustrate a side schematic view and a front view of an electronic device 50 having a housing 60 in the form of a grip 400 for use with a revolver type deterrent device 10. As is shown in FIGS. 23A and 23B, in this embodiment grip 400 has two housing parts 410a and 410b that are assembled to deterrent device 10 by way of a fastener 420 that extends through an opening in housing part 410, through a portion of frame 12 of deterrent device, to mating threads positioned on housing part 410b. Other forms of attachment can be used.

In this embodiment, housing part 410a has a power supply 110, a laser module 120, a sensing system 140 and a control system 150. Sensing system includes a switchless sensing system 200 with a first conductor 210, a second conductor 220, a first conductive surface 212 and a second conductive surface 222 which collectively operate as is generally described above to create an electric field 270 that extends outside an insulator 300 shown here as a portion of housing 60 such that a sensing space 280 is created in an area proximate to but apart from first conductive surface 212 and second conductive surface 222 in which the presence of a finger of a user can be sensed on the basis of changes in capacitance in sensing space 280 that does not require contact between the conductive surfaces 212 and 222 and a finger.

FIGS. 23A and 23B illustrate first conductive surface 212 and second conductive surface 222 positioned on grip housing part 410a which is arranged to position first conductive surface 212 and second conductive surface 222 so that they are within a grip housing part 410a such that frontal outer surface 430 provides a insulator 300. As is also shown in this embodiment, first conductive surface 212 and second conductive surface 222 are provided under a trigger guard 18 so that when either a left handed person or a right handed person grips deterrent device 10 a finger will be positioned within sensing space 280. In this embodiment, a seam 422 between first grip housing part 410a and second grip part 410b is shown having the optional feature of extending in part past a midline of deterrent device 10 for the purpose of extending first conductive surface 212 and second conductive surface 222 past the midline of deterrent device 10 so that sensing space 280 can extend over the midline as well. However in embodiments sensing space 280 may defined to detect a finger passing under trigger guard 18 either from the left or the right side and may do by defining an electric field 270 that can sense the presence of such a finger without the expedient of a midline extension.

Figures 24A, 24B:
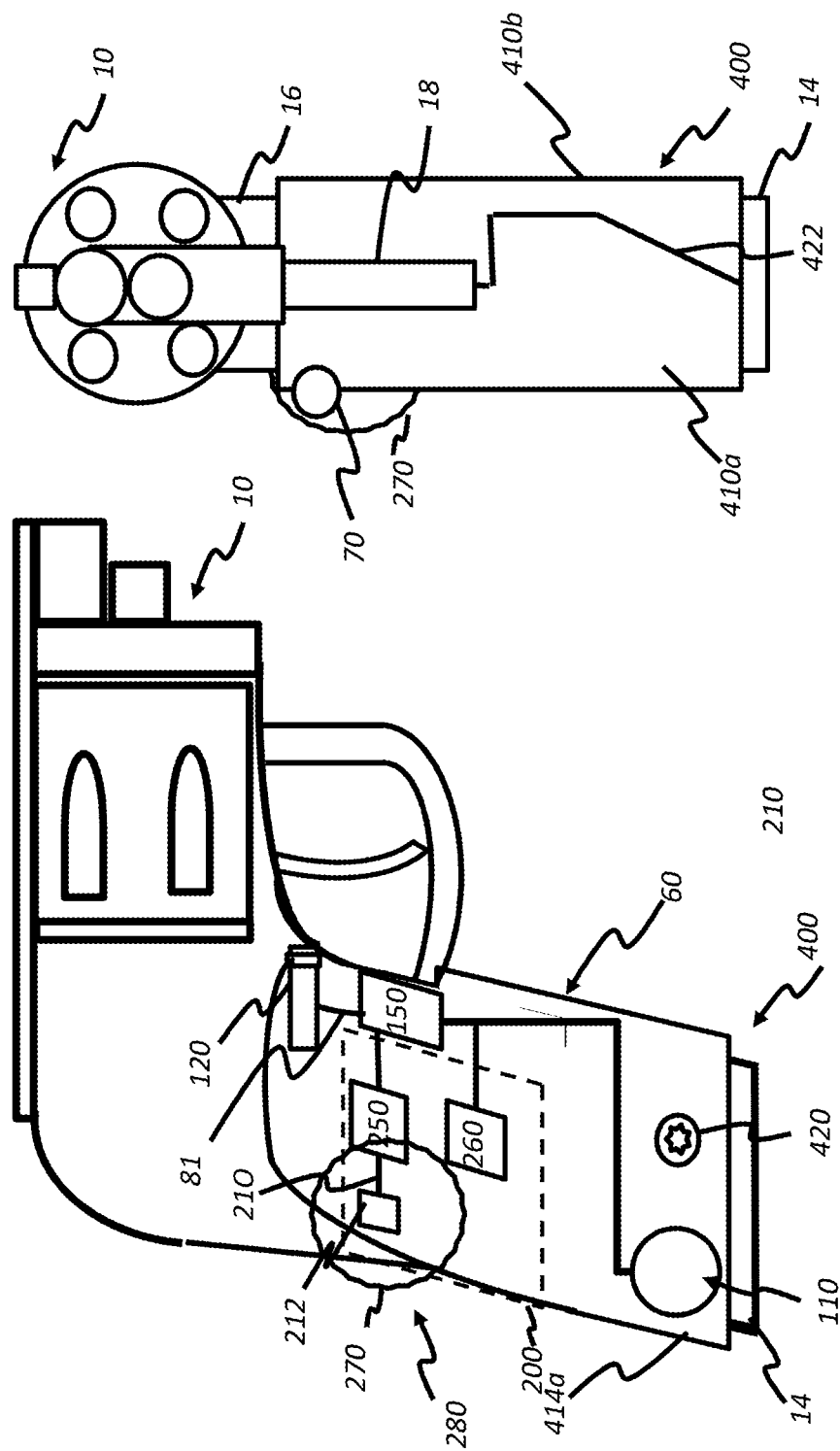
FIGS. 24A and 24B illustrate another embodiment of an electronic device having a switchless sensing system incorporated into a grip of a deterrent device.

FIGS. 24A and 24B illustrate an embodiment of a grip combination having an alternative location of sensing space 280 positioned on a rear portion of grip 414a, to create a sensing space 280 proximate to an upper rear portion of deterrent device 10 where a palm of a right handed person or a of a left handed person will wrap around deterrent device 10. This too provides an a sensing space 280 at a location that will be sensitive to both a right handed and a left handed grip. It will be appreciated that in this embodiment, only a single conductive surface 212 is used. However, it will be appreciated that embodiments of switchless sensing system 200 having only a first conductive surface 212 and embodiments of switchless sensing system 200 may be used in any form or packaging of switchless sensing system 200. It will be appreciated that components illustrated on grip portion 414a may be located on grip portion 414b and elsewhere on grip 14 of deterrent device 10.

In embodiments switchless sensing system 200 may be provided in a modular form with switchless sensing system 200 having a first conductive surface 212 or having a first conductive surface 212 and a second conductive surface 222, an excitation source 250, a capacitance sensing circuit 260. A modular switchless sensing system 200 can be provided as an aftermarket product for integration with existing electronic devices that are adapted for integration with such products and that are for example of the type used with deterrent devices or can be modularly designed to substitute for components of, to be inserted into, or to be integrated by otherwise modifying existing electronic devices useful with deterrent devices.

Figure 25:
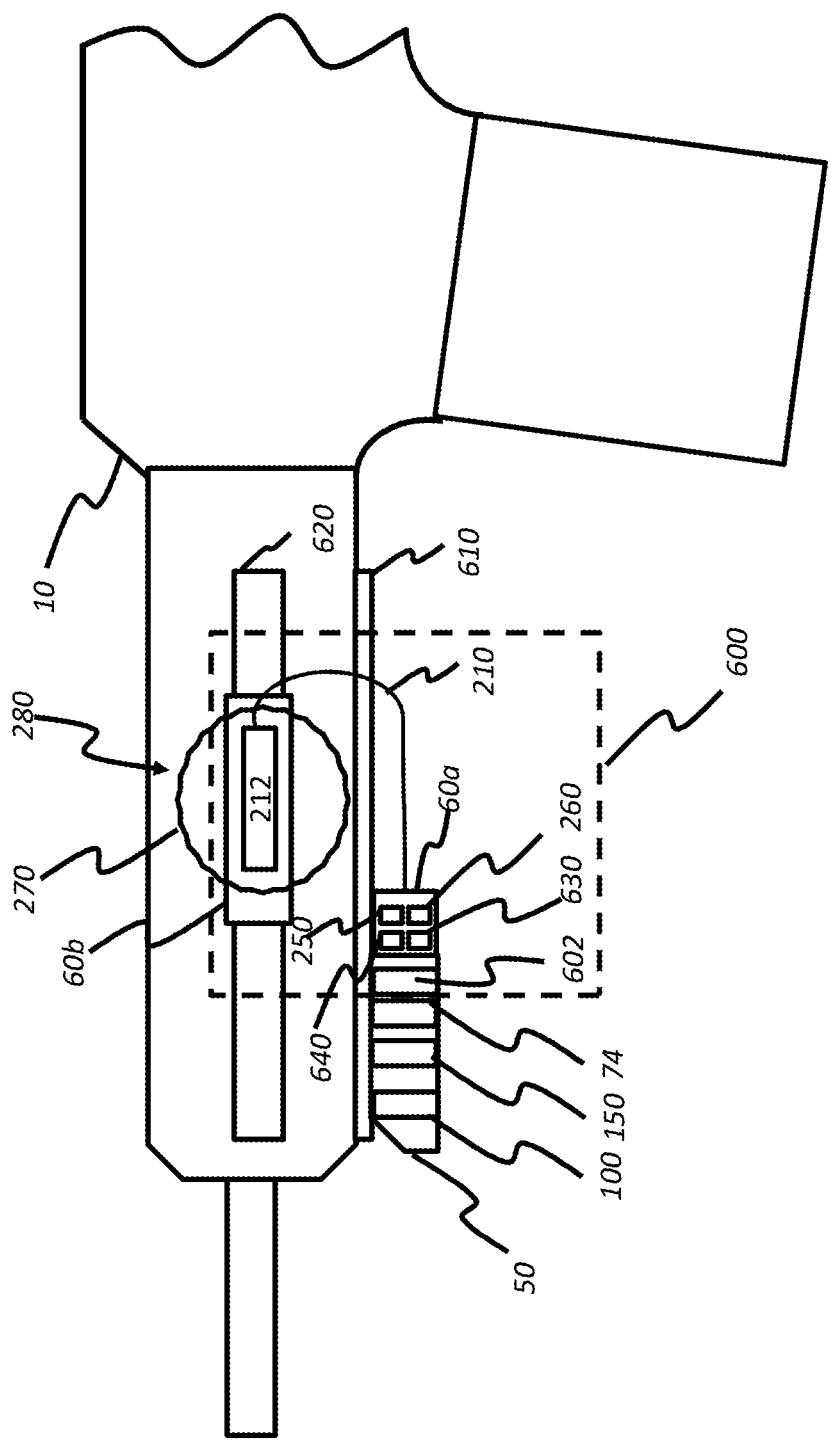
FIG. 25 illustrates another embodiment of an electronic device having a modular embodiment of a switchless sensing system.

For example in FIG. 25 an electronic device 50 is shown joined to a rail 610 of a cut away portion of a deterrent device 10. In this embodiment having a port 74 that is adapted to receive signals from which a control system 150 can make decisions regarding activation of electronic system 100. In this embodiment, a modular embodiment of switchless sensing system 200 is shown having a housing part 60a with an engagement portion 602 for engaging port 74 in a way that allows signals to pass between capacitive sensing system 260 and control system 150 and can be adapted to provide signals in a manner are useful to processor 150 in making decisions such as signals at levels and in forms that other devices that engage port 74 are designed to provide. As is shown here, first conductor 210 extends outside of housing part 60b to a housing part 60a which positions first conductive surface 212, and optionally, second conductive surface 222 (not shown in this embodiment) so that an electric field 270 can be provided in a sensing space 280. In this embodiment electronic device 50 and housing part 60b are mounted, fixed, assembled, joined or otherwise mechanically associated with rails 610 and 620 of deterrent device 10. Optionally, housing part 60a can also be mounted, fixed, assembled, joined or otherwise mechanically associated to rail 610. In this embodiment optional power supply 630 is illustrated in housing part 60a so that it is not necessary to supply power from electronic device 50 to operate switchless sensing system 200. Also shown in the embodiment of FIG. 19 is an optional processor 640 is provided to adapt or convert or otherwise process signals from capacitance sensing circuit 260 for use by control system 150. In embodiments, housing part 60*a* can be adapted to replace an existing removable component of electronic device 50 and optional processor 640 to directly control some aspect of the operation of electronic device 50 based upon the switchless sensing of objects in sensing space 280.

It will be appreciated from embodiments herein that sensing functions can be provided at positions apart from the electronic system 100 to be activated or otherwise controlled based upon the switchless sensing of changes in sensing space 280. Additionally, it will be appreciated that in embodiments, conductors can be positioned inside or outside of a housing of an electronic system 100, modular switchless sensing system 200 or deterrent device 10.

In embodiments, more than one sensing space 280 can be provided on one or both of grip housing parts 410*a* and 410*b* or on multiple places on a deterrent device 10. For example sensing spaces 280 can be provided on both the locations illustrated in FIGS. 23A and 23B and in 24A and 24B to provide redundant sensing. Additionally, sensing spaces 280 can be provided separately on grip housing part 410*a* and 410*b* and positioned to sense the presence of a right handed palm and a left handed palm respectively.

Other locations are possible. In embodiments one or more sensing spaces may be provided at any of a number of positions on a deterrent device 10 with one or more component of deterrent device 10 serving as a contact barrier 60. In one non-limiting example, an additional conductive surface can be positioned apart from first conductive surface 212 and second conductive surface 222 with excitation system 250 exciting the additional conductive surface relative to one of the first conductice surface 212 and the second conductive surface 222 to create an additional electric field between the at least one of first conductive surface 212 and second conductive surface 222, with capacitive sensing circuit 260 measuring an additional capacitance between the additional conductive surface and the at least one of the first conductive surface and the second conductive surface 222. In such an embodiment, control system 150 may make decisions regarding the operation of electronic device 50 based upon at least one of the measured capacitance between first conductive surface 212 and second conductive surface 222 and the measured additional capacitance.

In embodiments, insulator 300 may be omitted allowing, for example, direct contact with first conductive surface 212 and capacitance sensing system 260. Similarly, in embodiments, using a second conductive surface 222, direct contact with both of a first conductive surface 212 and a second conductive surface 222 may not be blocked by an insulator 300.

However, in such embodiments control system 140 does not activate or make other control decisions based upon sensing direct contact or maintaining direct contact with both of a first conductive surface 212 or second conductive surface 222. Instead, as is described above, the presence of a hand or finger anywhere within the sensing space 280, as indicated by a change in capacitance, is the condition that is used by control system 150 when making decisions as to whether to activate or maintain activation of electronic device 50. Further, it will be appreciated that changes in capacitance indicative of the presence of a finger will occur well before a finger makes contact with either of first conductive surface 212 or second conductive surface 222 such that a determination as to whether to activate electronic system 200 can be made as finger enters sensing space 280 which, in turn, can occur well before contact is made with first conductive surface 212 or second conductive surface 222 in such an embodiment. Additionally, in such embodiments, a separation of contact between a finger and first conductive surface 212 or second conductive surface 222 is not determinative of decisions to deactivate electronic system 200. Instead, in this example deactivation is based upon a presence or absence of a part of a body of a user of a deterrent device within sensing space 280. Further, such shorting events will be associated with unique electrical signatures and such signatures may be filtered or ignored by capacitance sensing system 260 from electrical signals provided to control system 150 or can be detected and ignored by control system 150. However, it will be appreciated that as described and claimed herein, activation, deactivation and other decisions are made by control system 150 are based upon changes in capacitance measures and not based or maintained based upon such shorting.

Additionally, as is illustrated in FIG. 11 as well as in FIGS. 23A and 23B a sensing space 280 may include an activation portion 320 proximate to the insulator 300 and a deactivation portion 324 separated from insulator 300 by the activation portion. In one embodiment of this type sensed capacitances within a first range may be associated with the activation portion while sensed capacitances within a second range may be associated with the deactivation portion. In such embodiments, control system 150 may be adapted to activate electronic system 100 the capacitance in sensing space 280 is within a range of values that indicates that a part of a hand that grips the deterrent device is in the activation portion. However, in such embodiments, control system 150 may be further adapted to activate, deactivate or make other decisions about operating electronic system 100 when, within a predetermined period of time, the sensed capacitance changes in a manner that indicates that a part of a hand that grips the deterrent device has left the activation portion 320 and is in the deactivation portion 324. Optionally, as is also illustrated in FIGS. 23A and 23B sensing space 280 may include a buffer portion 322 between the activation portion 320 and the deactivation portion 324 with the control system 150 being adapted to activate electronic system 100 when the capacitance sensed in sensing space 280 indicates that within a predetermined period of time a part of a hand that grips the firearm has left the activation portion 324 and the buffer portion 324 and is then detected in the deactivation portion 324. In embodiments, separate conductive surfaces can be provided for sensing one or more of a multi-portion sensing space 280.

It will be understood that any illustrations of an electric field 270 as illustrated herein are provided for the purpose of illustrating the concept that electric fields formed about first conductive surface 212 or about and between portions of first conductor 210 and second conductor 220 at first conductive surface 212 and second conductive surface 222 may include electric fields 270 that extend through a insulator 300 such that sensing of a change in capacitance can occur without necessarily directly exposing first conductive surface 212 or second conductive surface 222 to contact with external matter or objects. The exact shape or size of an electric field 270 generated in a particular application will depend upon characteristics of the excitation signal, characteristics of the conductors, the conductive surfaces 212 and characteristics of the materials occupying space through which the field lines pass. Accordingly, the shapes illustrated for electric field 270 used to herein are not limiting unless otherwise stated or claimed herein. Further it will be understood that any such drawings or discussion describes an electric field as it exists in a particular moment in time and that such fields may change during excitation or when alternating current is used.

For example, it will be understood that the total measured capacitance between first conductive surface 212 and capacitive sensing circuit 260 or between first conductive surface 212 and second conductive surface 222 depends in part on the dielectric properties of the materials surrounding first conductive surface 212 and second conductive surface 222 and that the exact shape of electric field 270 arising in a given implementation may or may not have the shapes provided here. Additionally it will be appreciated that the lines used to illustrate electric field 270 are not intended to suggest that exact borders are provided for an electric field. Rather electric fields diminish in intensity as a function of distance from the source and detection of and extend in a continuum as distance from a source increases. However, there are distances at which the intensity of the electrostatic field diminishes to a point where interactions are difficult to detect in a reliable fashion as against background noise and such may serve as practical limitations for an electric field having a predetermined intensity.

Further it will be understood that unless otherwise stated herein the drawings provided are not necessarily to scale.

While the present invention has been particularly shown and described with references to preferred embodiments thereof, it will be understood by those skilled in the art that various changes in form and details may be made therein without departing from the spirit and scope of the invention as defined by the appended claims.

What is claimed is:

1. An electronic device for use with a deterrent device comprising:
    a housing with a mounting portion joinable to the deterrent device to position a conductive surface relative to a sensing space where a part of the body of the user of the deterrent device is expected to be found when using the deterrent device;
    an electronic system;
    an excitation system connected to the conductive surface and adapted to cause a time varying electric field to be created about the conductive surface; and
    a capacitance sensing circuit adapted to sense capacitance between the conductive surface and the capacitance sensing circuit;
    a control system connected to the capacitance sensing circuit and adapted to detect changes in the sensed capacitance and adapted make decisions about the operation of the electronic system based upon the detected changes; and
    an insulator preventing electrical conduction between the body of the user and at least one of the conductive surface and the capacitive sensing circuit;
    wherein the electric field extends through the insulator into the sensing space so that the presence of the part of the body in the sensing space will change the sensed capacitance, wherein the sensing space includes a deactivation portion separated from the conductive surface by the activation portion and wherein the control system is adapted to deactivate the electronic system when the condition indicates that within a predetermined period of time a part of a hand of a user that grips the firearm has left the activation portion and is then detected in the deactivation portion.

2. The electronic device of claim 1, wherein the measured capacitance has a first range of values when air is positioned in the sensing space and a second range of values when a portion of a body is positioned in the sensing space.

3. The electronic device of claim 1, wherein the deterrent device comprises a firearm and the conductive surface comprises a component of the firearm electrically connected one of the excitation system and the capacitance sensing circuit.

4. The electronic device of claim 1, wherein the conductive surface comprises a conductive component of at least one of a trigger guard, a grip, a foregrip, a sight, a scope, a spring, a chamber, a receiver, a safety, a forearm, a stock, a trigger, a magazine, a barrel, a rail, and a handle of the deterrent device.

5. The electronic device of claim 1, wherein the sensing space is proximate to at least one of a grip, a sight, a scope, a spring, a chamber, a receiver, a safety, a forearm, a stock, a magazine, a rail, and a handle of the deterrent device.

6. The electronic device of claim 1, wherein the sensing space includes a deactivation portion separated from the housing by the activation portion and a buffer portion and wherein the control system is adapted to activate the electronic circuit when control system detects that the sensed capacitance indicates that within a predetermined period of time a part of a hand of the user that grips the firearm has left the activation portion and the buffer portion and is then detected in the deactivation portion.

7. The electronic device of claim 1, wherein the sensing space has a length determined in part by a length of the conductive surface and in part by an intensity of an excitation signal used to create the electric field.

8. The electronic device of claim 1, wherein the sensing space i-s has a width determined in part by a width of the first conductive surface and an intensity of an excitation signal used to create the electric field.

9. The electronic device of claim 1, wherein the sensing space has a depth determined in part by a proximity of the first conductive surface to the insulator and an intensity of an excitation signal used to create the electric field.

10. The electronic device of claim 1, wherein the control system determines that a portion of the body is in an activation portion of the sensing space when a capacitance is measured that is indicative of the presence of the part of the body within a first range of distances from the conductive surface, and determines that a portion of a body is in a deactivation portion when a capacitance is measured that is indicative of the body being in a range of distances beyond the first range of distances from the conductive surface.

11. The electronic device of claim 1, wherein the conductive surface is positioned so that the electric field extends predominantly to one side of the electronic device.

12. The electronic device of claim 1 further comprising an additional conductive surface creating an additional electric field and an additional sensing space apart from the sensing space wherein the capacitive sensing system is adapted to measure capacitance between the additional conductive surface and the capacitive sensing system and wherein the controller is adapted to control operation of the electronic device based upon at least one of the capacitance measured in the sensing space and the capacitance measured in the additional sensing space.

13. The electronic device of claim 1, wherein the control system is adapted to adjust decision making logic used to determine when to activate the electronic system based upon capacitance measurements made when the deterrent device is not in use.

14. The electronic device of claim 1, wherein the control system is adapted to adjust decision making logic used to determine when to activate the electronic system based upon capacitance measurements made when the deterrent device is in use.

15. The electronic device of claim 1, wherein the control system is adapted to adjust decision making logic used to determine when to deactivate the electronic system based upon capacitance measurements made when the deterrent device is not in use.

16. The electronic device of claim 1, wherein the housing comprises a component of a firearm.

17. The electronic device of claim 1, wherein the insulator comprises part of a firearm.

18. An electronic device for use with a deterrent device comprising:
  a housing with a mounting portion joinable to the deterrent device to position a first conductive surface relative and a second conductive surface relative to a sensing space where a part of the body of the user of the deterrent device is expected to be found when using the deterrent device;
  an electronic system;
  an excitation system connected to at least one of the first conductive surface and the second conductive surface and adapted to cause a time varying electric field to be created about the first conductive surface and the second conducive surface;
  and a capacitance sensing circuit adapted to measure a capacitance between the first conductive surface and the second conductive surface;
  a control system connected to the capacitance sensing circuit and adapted make decisions about the operation of the electronic system based upon detected changes in the capacitance between the first conductive surface and the second conductive surface;
  and an insulator preventing electrical conduction between the body of the user and at least one of the first conductive surface and the second conductive surface;
  wherein the electric field extends through the insulator into the sensing space so that the presence of the part of the body in the sensing space will change the capacitance measured between the first conductive surface and the second conductive surface, wherein the sensing space includes a deactivation portion separated from the conductive surface by the activation portion and wherein the control system is adapted to deactivate the electronic system when the condition indicates that within a predetermined period of time a part of a hand of a user that grips the firearm has left the activation portion and is then detected in the deactivation portion.

19. The electronic device of claim 18, further comprising an additional conductive surface positioned apart from the first conductive surface and the second conductive surface and wherein the excitation system excites the additional conductive surface to create an additional electric field between at least one of the first conductive surface and the second conductive surface, the capacitive sensing circuit measures an additional capacitance between the additional conductive surface and the at least one of the first conductive surface and the second conductive surface and the control system makes the decisions regarding the operation of the electronic device based upon at least one of the measured capacitance between the first conductive surface and the second conductive surface and the measured additional capacitance.

20. The electronic device of claim 18, wherein the first conductive surface and the second conductive surface are positioned relative to each other in a manner that is intended at least in part to shape the sensing space.

21. A deterrent device comprising:
  a deterrent system adapted for user control;
  an electronic system to assist the user in using the user controlled deterrent system;
  a housing with a mounting portion joinable to the deterrent system to position a first conductive surface relative to a sensing space where a part of the body of the user of the deterrent device is expected to be found when controlling the deterrent system; an electronic system;
  an excitation system connected to the conductive surface and adapted to cause a time varying electric field to be created about the first conductive surface;
  a capacitance sensing circuit adapted to sense capacitance between the conductive surface and the capacitance sensing circuit;
  a control system connected to the capacitance sensing circuit and adapted to detect changes in the sensed capacitance and adapted make decisions about the operation of the electronic system electronic system based upon the detected changes; and
  an insulator preventing electrical conduction between the body of the user and at least one of the conductive surface and the capacitive sensing circuit;
  wherein the electric field extends through the insulator into the sensing space so that the presence of the part of the body in the sensing space will change the sensed capacitance, wherein the sensing space includes a deactivation portion separated from the conductive surface by the activation portion and wherein the control system is adapted to deactivate the electronic system when the condition indicates that within a predetermined period of time a part of a hand of a user that grips the firearm has left the activation portion and is then detected in the deactivation portion.

* * * * *